(12) United States Patent
Sugizaki et al.

(10) Patent No.: US 7,042,083 B2
(45) Date of Patent: May 9, 2006

(54) PACKAGE SUBSTRATE AND A FLIP CHIP MOUNTED SEMICONDUCTOR DEVICE

(75) Inventors: Yoshiaki Sugizaki, Yokohama (JP); Hiroshi Ikebe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 10/756,507

(22) Filed: Jan. 14, 2004

(65) Prior Publication Data
US 2004/0207094 A1 Oct. 21, 2004

(30) Foreign Application Priority Data
Feb. 21, 2003 (JP) ............................ P2003-045018

(51) Int. Cl.
*H01L 23/12* (2006.01)
(52) U.S. Cl. ...................... 257/701; 257/703
(58) Field of Classification Search ................ 257/710, 257/730, 731, 680, 678, 701, 703, 736, 748
See application file for complete search history.

(56) References Cited

U.S. PATENT DOCUMENTS 6,333,857 B1 * 12/2001 Kanbe et al. ................ 361/792
6,433,412 B1 * 8/2002 Ando et al. .................. 257/678

FOREIGN PATENT DOCUMENTS

| JP | 62-52988 | 3/1987 |
| JP | 2002-223070 | 8/2002 |
| JP | 2002-332544 | 11/2002 |
| JP | 2002-353584 | 12/2002 |
| JP | 2003-31719 | 1/2003 |

* cited by examiner

*Primary Examiner*—Roy Potter
(74) *Attorney, Agent, or Firm*—Finnegan, Henderson, Farabow, Garrett & Dunner, L.L.P.

(57) ABSTRACT

The present invention provides a package substrate which comprises a substrate defined by top and bottom surfaces and having a plurality of perforations; a resin insulation layer configured to implement a multi-level structure disposed on both surfaces of the substrate; a built-up wiring layer implementing the multi-level structure disposed on the resin insulation layer on both surfaces of the substrate; and a semiconductor chip mounting region provided on the top or the bottom surface of the substrate; wherein, a perforation exists on any straight line connecting from the center of the substrate to an arbitrary point on a periphery of the substrate.

21 Claims, 20 Drawing Sheets

11    10

PACKAGE SUBSTRATE AND A FLIP CHIP MOUNTED SEMICONDUCTOR DEVICE

CROSS REFERENCE TO RELATED APPLICATIONS

This application is based upon and claims the benefit of priority from prior Japanese Patent Application P2003-045018 filed on Feb. 21, 2003; the entire contents of which are incorporated herein by reference.

BACKGROUND OF THE INVENTION

1. Field of the Invention

The present invention relates to semiconductor packaging. In particular, it is related to a package substrate and a flip chip mounted semiconductor device.

2. Description of the Related Art

Conventionally, a flip chip mounted semiconductor package includes either a ceramic substrate or resin substrate, which is used as a package substrate for wiring to mount a semiconductor chip. A semiconductor chip is connected to the package substrate via flip chip connection bumps made from soldering balls, and in order to protect that connection area, thermosetting resin, which is called underfill resin, is filled thereto. On the surface of the package substrate there are formed external connection electrodes for making electrical connections with the mounting substrate, so as to provide a connection with the package substrate via ball grid array (BGA) balls, which are soldering balls mounted on these external connection electrodes. A feature of the flip chip mounted semiconductor package is that the respective connecting portions of the flip chip connector and the BGA connector are each sandwiched with differing materials. In other words, the flip chip connector is generally sandwiched between a semiconductor chip made from silicon and a package substrate made from a ceramic or a resin. Also, the BGA connector is sandwiched between the package substrate and a mounting substrate generally made from fiber-reinforced resin such as FR-4.

It has been verified that decreases in the yield of conventional flip chip mounted semiconductor devices are mainly caused by damage due to the difference in thermal expansion between a semiconductor chip and the package substrate.

SUMMARY OF THE INVENTION

To overcome such problems in the related art, a first aspect of the present invention is a package substrate which comprises a substrate defined by top and bottom surfaces and having a plurality of perforations; a resin insulation layer configured to implement a multi-level structure disposed on both surfaces of the substrate; a built-up wiring layer implementing the multi-level structure disposed on the resin insulation layer on both surfaces of the substrate; and a semiconductor chip mounting region provided on the top or the bottom surface of the substrate; wherein, a perforation exists on any straight line drawn from the center of the substrate to an arbitrary point on the periphery of the substrate.

A second aspect of the present invention is a semiconductor device comprising: a semiconductor chip having a connection terminal; a package substrate comprising: a substrate defined by top and bottom surfaces and having a plurality of perforations; a resin insulation layer configured to implement a multi-level structure disposed on both surfaces of the substrate; a built-up wiring layer implementing the multi-level structure disposed on the resin insulation layer on both surfaces of the substrate; and a flip chip connection bump configured to make a flip chip connection between the semiconductor chip and the package substrate; and underfill resin configured to seal a gap between the package substrate and the semiconductor chip connected with the flip chip connection; wherein, a perforation would exist on any straight line drawn from the center of the substrate to an arbitrary point on the periphery of the substrate.

DETAILED DESCRIPTION OF THE EMBODIMENTS

Figure 1:
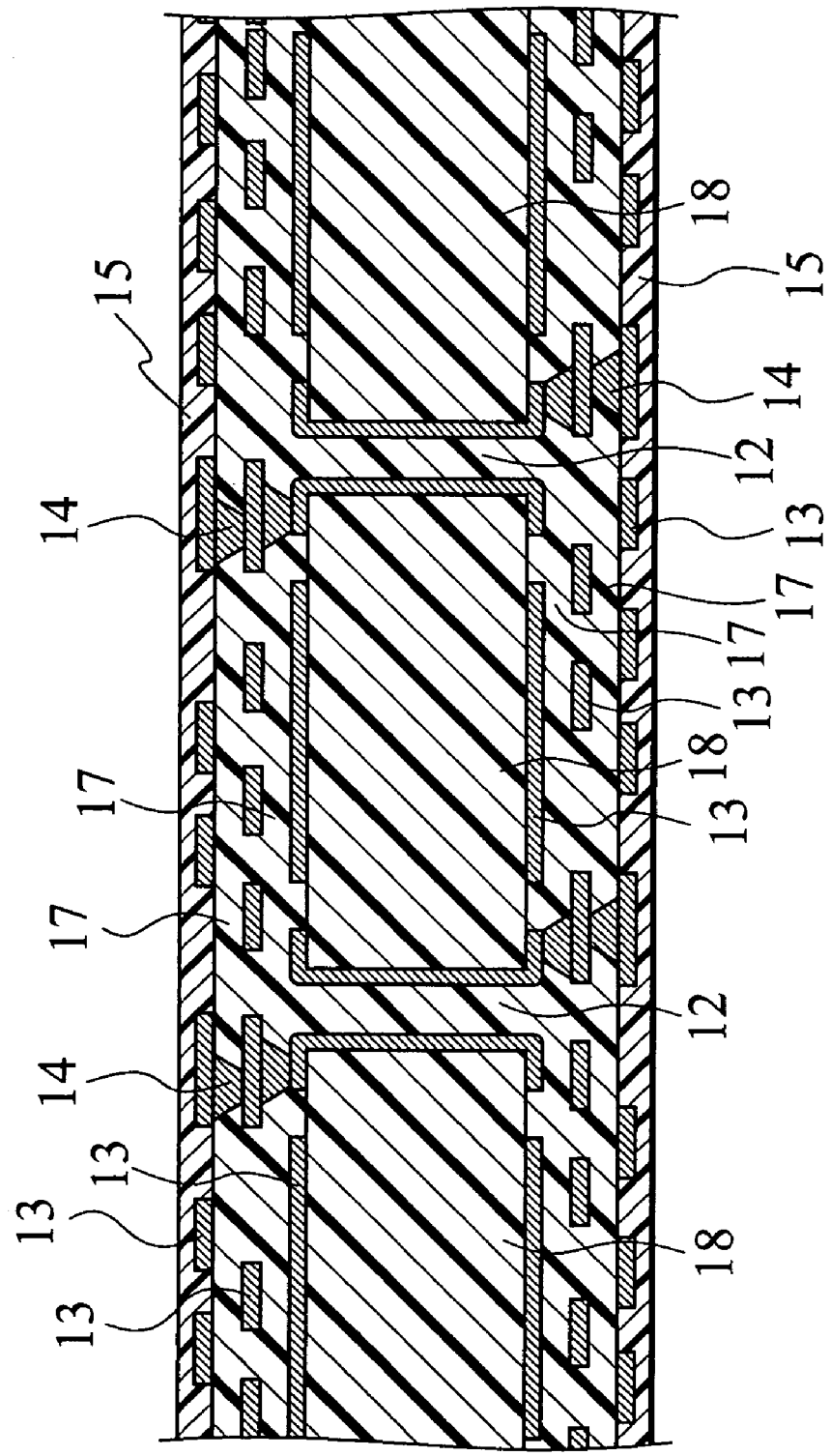
FIG. 1 is a schematic cross-sectional structural diagram showing the detailed structure of a package substrate used in a flip chip mounted semiconductor device given as a comparative example of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

In the embodiments illustrated below, any apparatus or method used to put into practice the technical scope of this invention is given only for illustrative purposes and the usage of the technical concept of this invention is not limited to that described below. The technical scope of the embodiments of this invention may also include various modifications within the scope of the patent claims.

COMPARATIVE EXAMPLE

As a comparative example of the present invention, a detailed structure of a package board used for a flip chip mounted semiconductor device is configured, as shown in FIG. 1, with a multi-layer structure including micro metal wiring 13, intermediate insulation layers 17, microvias 14, solder resist 15 on both sides of a resin substrate 18, and vias 12 which have the inner surfaces thereof covered with metal.

For the ceramic package substrate, alumina is normally used. The thermal expansion coefficient of the alumina is 5.5 ppm/° C. and that of the silicon is 3 ppm/° C., which are extremely close in value to the main material of the semiconductor chip, silicon. When using a resin package substrate, it is common to use a built-up board having layers of epoxy resin on a bismaleimide-triazine (BT) resin base. In this case, the thermal expansion coefficient of the BT is 17 ppm/° C., which is characteristically significantly different from the silicon. As a result, as far as the flip chip connection portion is concerned, the resin substrate is more susceptible to strain. In actual thermal cycle tests to demonstrate lifespan, when the number of cycles for a temperature change in the range of −65° C./125° C. it took for 50% of the chips to develop defects was compared for each substrate, the ceramic substrate took 1900 cycles while the resin substrate took only 1000 cycles, or approximately half the number of cycles.

Moreover, this difference in thermal expansion coefficients causes the semiconductor chip and package substrate to warp. In the exemplary case where an 18×18 mm semiconductor chip 1 is connected with a flip chip to a 50×50 mm package substrate, there is very little warpage when a ceramic substrate is used. Warpage was less than 10 μm for the chip mount portion, and 50 μm for the entire package. In contrast, when a resin substrate is used, the amount of warpage was extremely high; 100 μm for the chip mount portion and 270 μm for the entire package. Overall warpage in the package may cause degradation of the coplanarity of the BGA ball connection terminals. Normally, a coplanarity of 200 μm or less is required for BGA ball connection terminals in a flip chip mounted semiconductor device. Accordingly, in the case of the resin substrate described above, it is difficult to meet the requirement of coplanarity of 200 μm or less.

In a flip chip mounted semiconductor device using a resin substrate and having a mismatch of thermal expansion coefficients in the flip chip connection portion, there is (a) insufficient reliability in the flip chip connection portion, (b) poor coplanarity in the BGA ball 5 connection terminals, (c) insufficient heat dissipation, and (d) difficulty in using low dielectric constant intermediate insulation layers in the multi-layer wiring of the semiconductor chip 1.

In comparison with the resin substrate, the ceramic substrate is overwhelmingly disadvantageous as far as the BGA ball connection side is concerned. This is because the thermal expansion coefficient of the FR-4 used for the mounting substrate is 17 ppm/° C., while that of the alumina of the ceramic substrate is 5.5 ppm/° C. (difference of 11.5 ppm/° C.) and the BT of the resin substrate is 15 ppm/° C. (difference of 2 ppm/° C.). As a result, for example when a 32×25 mm package was subjected to −65° C./125° C. temperature cycle testing, while it took the ceramic substrate 500 cycles to reach a 50% defect level, the resin substrate had a lifespan of at least 1000 cycles. Since cumulative displacement increases in proportion to increases in the package size, the lifespan of the ceramic substrate becomes even shorter. Accordingly, the range of package sizes that can be used is limited with ceramic substrates.

Therefore, a package substrate and flip chip mounted semiconductor device having little difference in thermal expansion vis-à-vis the semiconductor chip and having little strain on flip chip connection bumps and the semiconductor chip surface are desirable in order to improve post-packaging yields.

In the first embodiment of the present invention, a package substrate used in the flip chip mounted semiconductor device of the present invention is described. In the second embodiment of the present invention, flip chip mounted semiconductor devices are described. In the third and fourth embodiment of the present invention, a metal plate core used in a package substrate and flip chip mounted semiconductor device of the present invention and characterized in the semiconductor chip mounting region is described. In the fifth embodiment of the present invention, a structural example of wire bonding a semiconductor chip using a package substrate of the present invention is described. In the sixth embodiment of the present invention, a flip chip mounted semiconductor device connected with a mounting substrate on both the undersurface and surface of a package substrate via solder balls is described. In the seventh embodiment of the present invention, a flip chip mounted semiconductor device with a mounted heat sink is described.

FIRST EMBODIMENT

Figure 4:
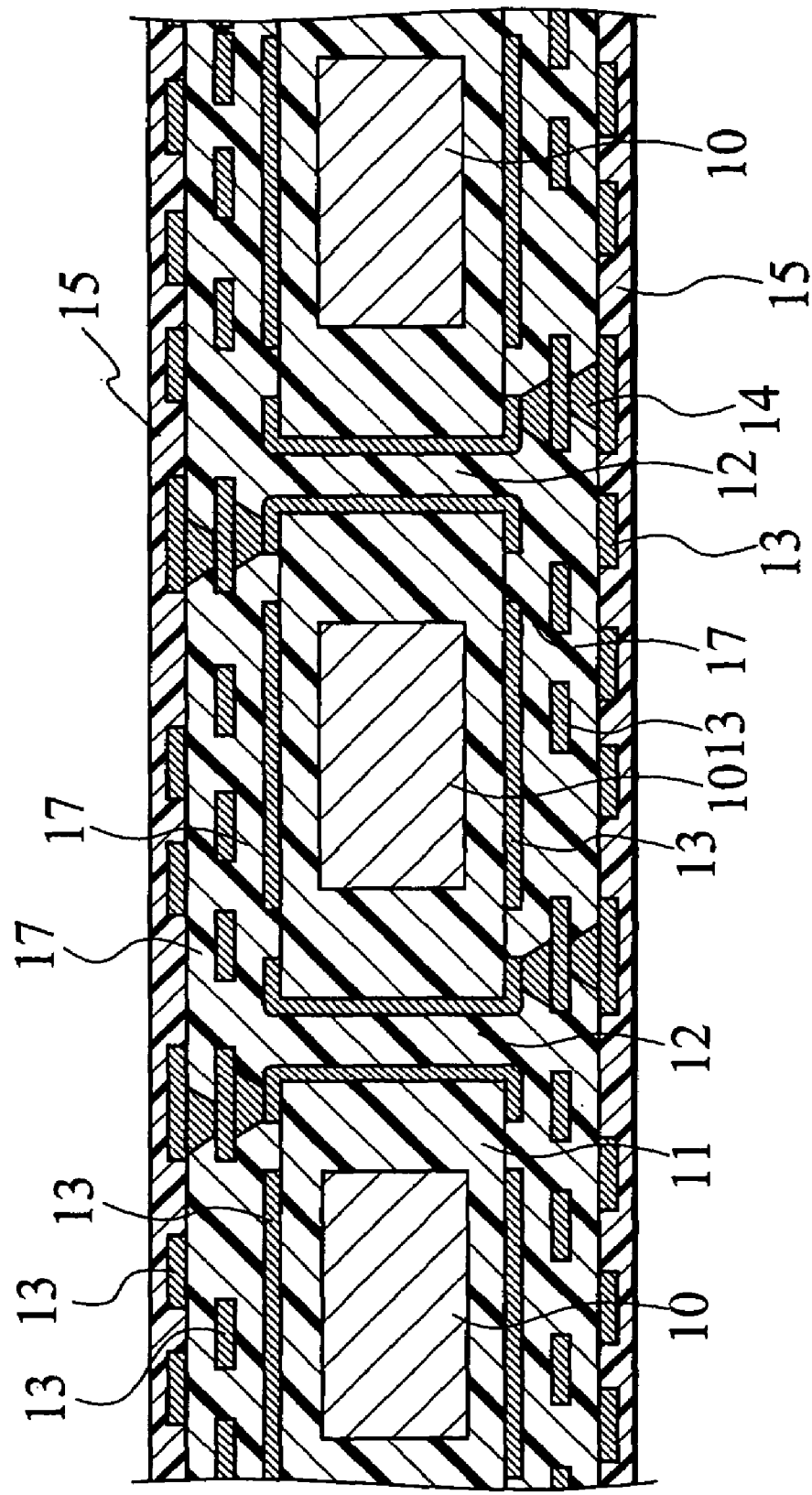
FIG. 4 is a schematic cross-sectional structural diagram showing the detailed structure of a package substrate used in a flip chip mounted semiconductor device according to a first embodiment of the present invention.

FIG. 4 is a schematic cross-sectional structural diagram showing the detailed structure of a package substrate used in a flip chip mounted semiconductor device according to a first embodiment of the present invention. The package substrate 9 according to the first embodiment of the present invention and used in a flip chip mounted semiconductor device encompasses, as shown in the cross-sectional enlarged view of FIG. 4; a metal plate core 10; perforations 11, which open to the metal plate core 10; a via 12, which is formed inside of a perforation 11; micro metal wiring 13; a micro via 14; and solder resist 15, which is formed on both the surface and undersurface of the package substrate 9. The package substrate 9 uses the metal plate core 10 as its core, and on both the surface and undersurface of this core, multiple wiring layers of micro metal wiring 13 are separated by intermediate insulation layers 17 of built-up resin. A plurality of perforations 11 are formed in the metal plate core 10, and inside a portion thereof a via 12 is formed to pass through and connect the upper and lower built-up wiring layers configured with micro metal wiring 13. A low thermal expansion metal such as an iron-nickel-manganese (Fe—Ni—Mn) alloy or invar is used for the metal plate core 10. Both the perforations 11 and the vias 12 are filled in during the fabrication process with an insulating resin such as glass epoxy.

A package substrate 9 according to the first embodiment of the present invention uses a low thermal expansion coefficient substrate 9 with a core 10 made of material having a low coefficient of thermal expansion, and has a multi-layer configuration of built-up wiring layers 13 on both surfaces substrate. As used herein, "both surfaces" refers to the over surface or more simply, the surface and undersurface of the substrate. As long as the material has a low coefficient of thermal expansion, the low thermal expansion coefficient substrate 9 may be a metal plate, a ceramic plate, or a glass plate. The following description uses an exemplary metal plate as the representative low thermal expansion coefficient substrate 9. In a flip chip mounted semiconductor device according to an embodiment of the present invention, a package substrate 9 made of a low thermal expansion material with, for example, a metal core 10, both sides thereof being layered with built-up wiring layers 13, and a semiconductor chip 1 are connected using a flip chip configuration. A plurality of perforations 11 or slits are formed in this metal core 10. The binding force of the connection terminals that connect with the mounting substrate 6 formed on the package substrate 9 surface is decreased by the perforations 11 or slits formed in the metal core 10 regardless of whether there is a difference in thermal expansion coefficients between the metal core 10 and the mounting substrate 6. On the other hand, since the metal core 10 has low thermal expansion, the difference in thermal expansion coefficients vis-à-vis the semiconductor chip 1 is small, and the strain on the flip chip connection bumps 3 and the semiconductor chip 1 surface becomes extremely small.

Figure 2:
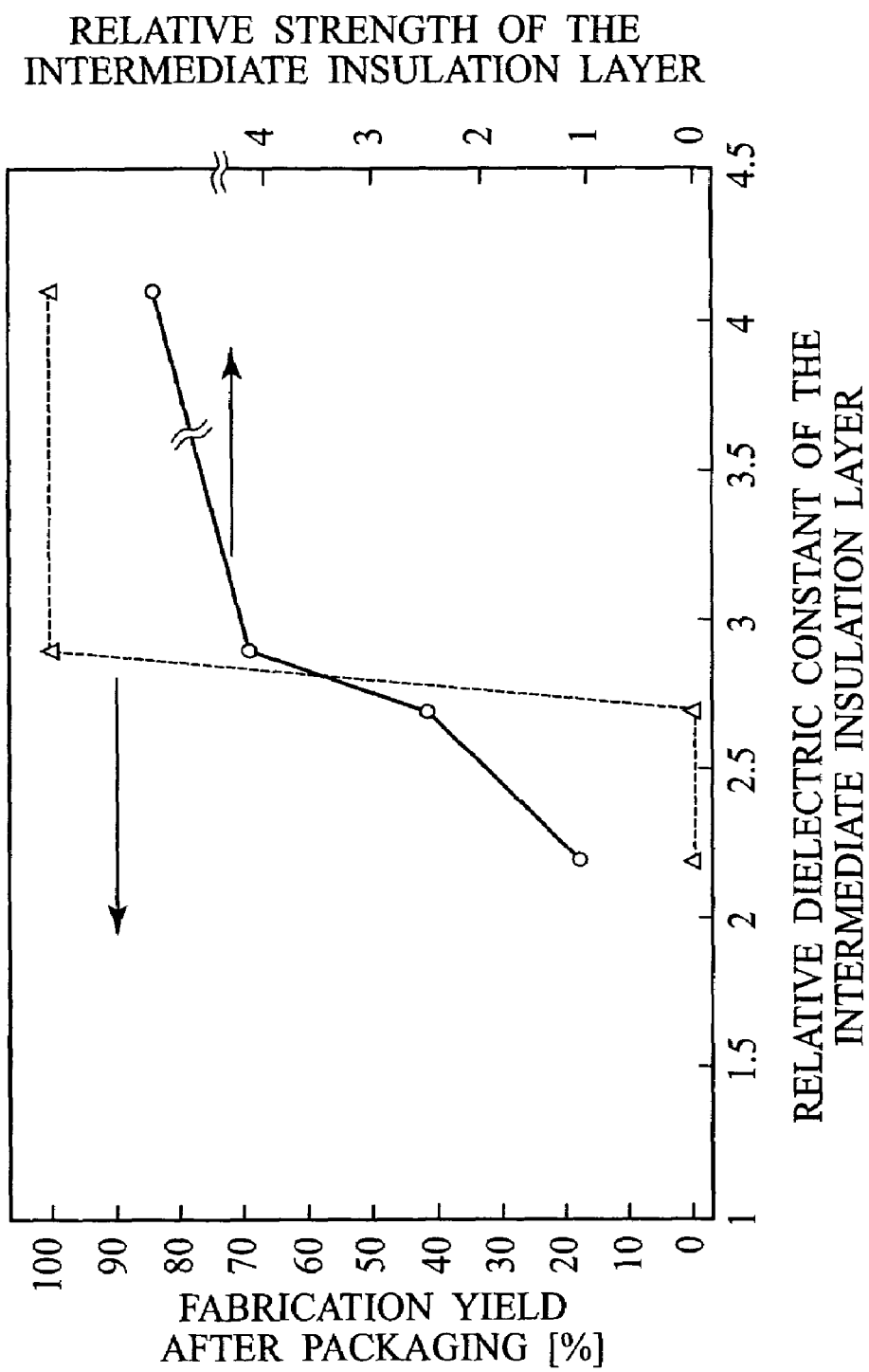
FIG. 2 is a diagram showing the relationship between the relative dielectric constant of the intermediate insulation layer in semiconductor chip multi-layer wiring, relative strength of intermediate insulation layer, and the fabrication yield after packaging.

FIG. 2 is a diagram showing the relationship between the relative dielectric constant of the intermediate insulation layer in semiconductor chip multi-layer wiring, relative strength of intermediate insulation layer, and the fabrication yield after packaging. The resultant fabrication yield after packaging and relative strength of the intermediate insulation layer using a resin substrate as the relative dielectric constant of the intermediate insulation layers in the multi-layer wiring configuring a semiconductor chip changes. FIG. 2 shows a steep change of the relative dielectric constant of the intermediate insulation layers between 2.5 and 3.0. The solid line shows the relative strength of the intermediate insulation layers, and the dashed line shows the fabrication yield after packaging. In order to speed up the performance of the current semiconductor chips, the multi-layer wiring portion tends to employ intermediate insulation layers with a low dielectric constant called Low-k. Nevertheless, as is evident from FIG. 2, lowering the relative dielectric constant causes the strength of the intermediate insulation layers as well as the fabrication yield after packaging to drop dramatically.

Figure 3:
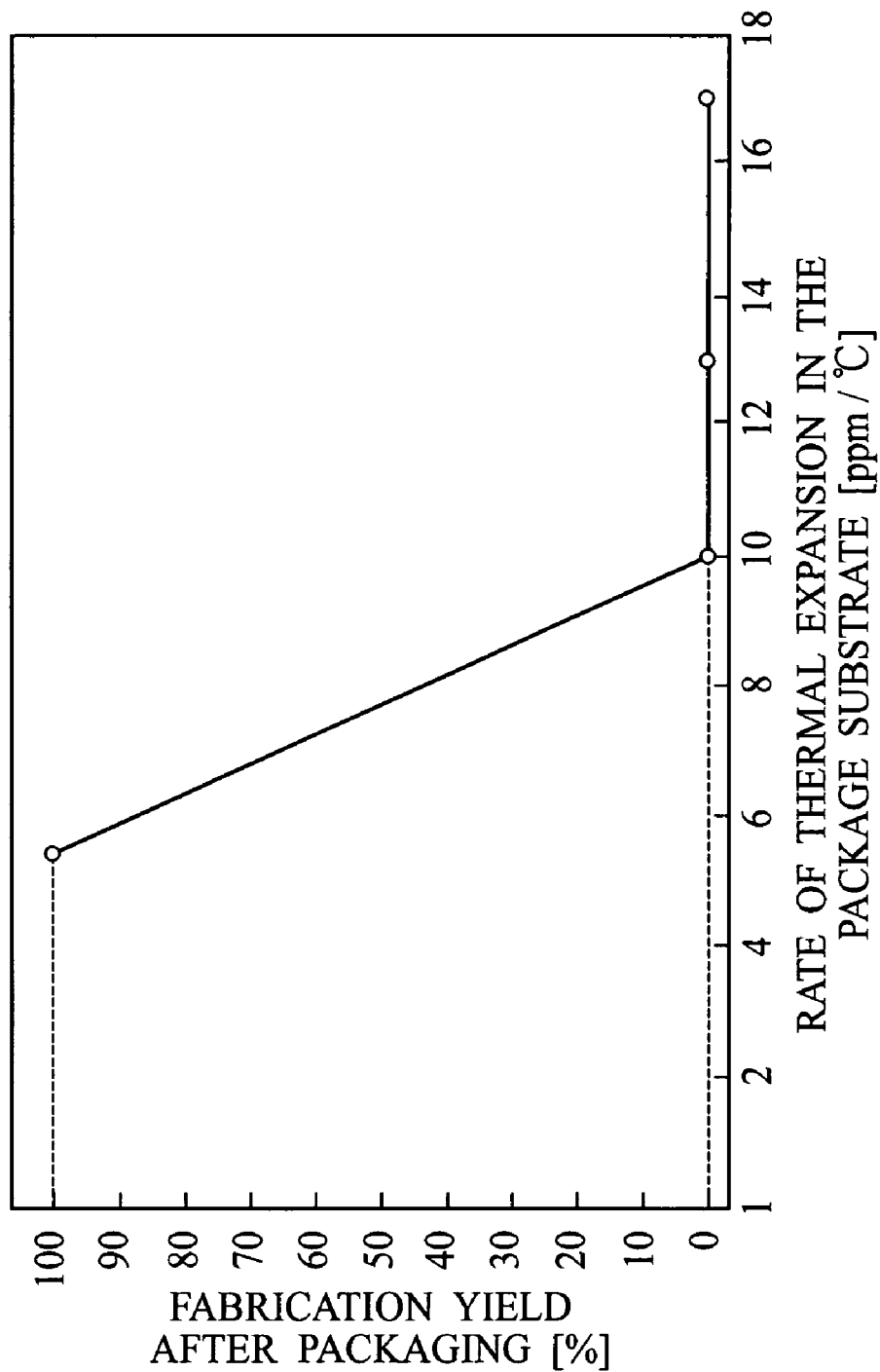
FIG. 3 is a diagram showing the relationship between the thermal expansion coefficient of the package substrate and the fabrication yield after packaging.

FIG. 3 is a diagram showing the relationship between the thermal expansion coefficient of the package substrate and the fabrication yield after packaging. In the case where a semiconductor chip 1 having Low-k intermediate insulating layers with a relative dielectric constant of 2.7 is packaged using a package substrate 9 with a differing thermal expansion coefficient, the resultant fabrication yield drops dramatically when the package substrate thermal expansion coefficient is between 6 ppm/° C. and 10 ppm/° C., as shown in FIG. 3. As evident from FIG. 3, the yield becomes more favorable as the package substrate thermal expansion coefficient decreases. Since the yield is improved by lowering the thermal expansion, it can be verified that decreases in yield with conventional flip chip mounted semiconductor devices are caused by damage due to the difference in thermal expansion between a semiconductor chip and the package substrate.

SECOND EMBODIMENT

Figure 5:
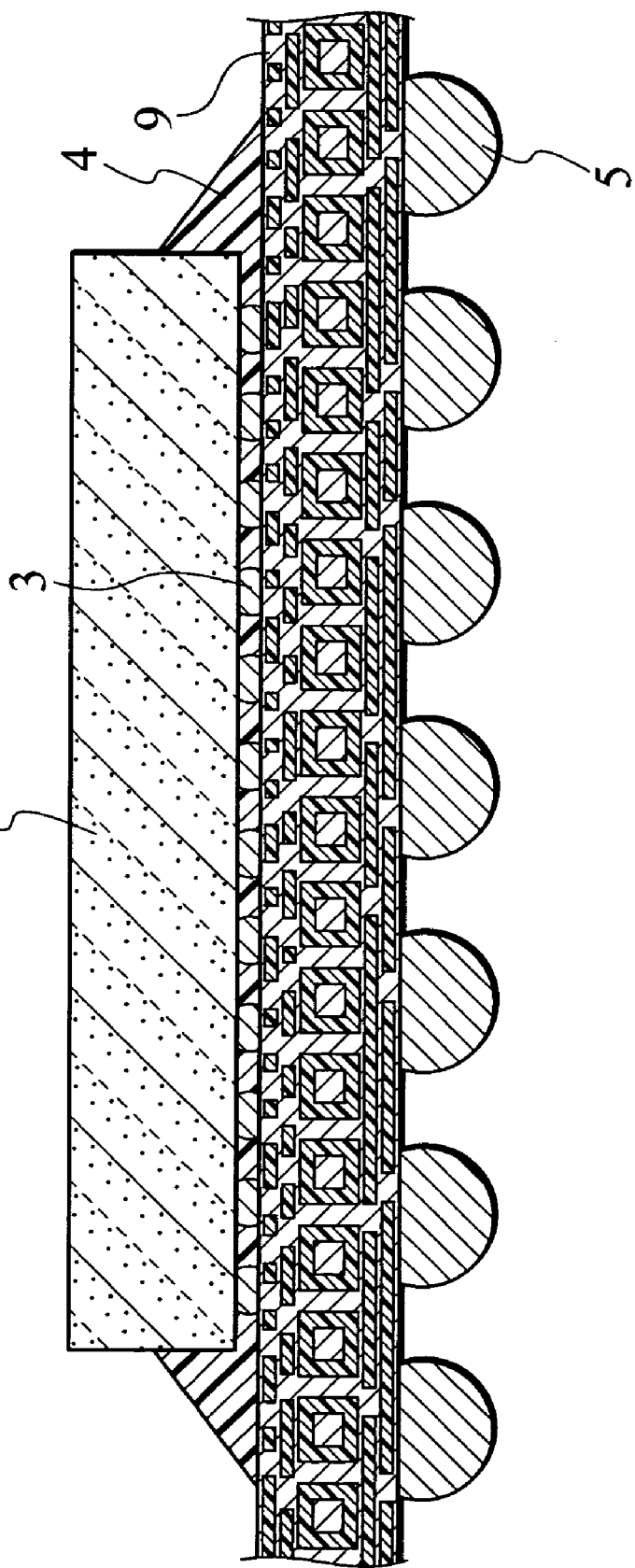
FIG. 5 is a schematic cross-sectional structural diagram of a flip chip mounted semiconductor device according to a second embodiment of the present invention.

FIG. 5 is a schematic cross-sectional structural diagram of a flip chip mounted semiconductor device according to a second embodiment of the present invention. The flip chip mounted semiconductor device according to the second embodiment of the present invention encompasses, as shown in the illustrative cross-sectional structure of FIG. 5, a package substrate 9; a semiconductor package 1, which is connected with the package substrate 9 via flip chip connection bumps 3; underfill resin 4, which protects the connection portion between the package substrate 9 and the semiconductor package 1; and BGA balls 5, which are formed on the surface of the package substrate 9. In FIG. 5, the internal structure of package substrate 9 is shown schematically. The detailed structure of package substrate 9 is as shown in FIG. 4.

MODIFIED EXAMPLE 1 OF THE SECOND EMBODIMENT

Figure 6:
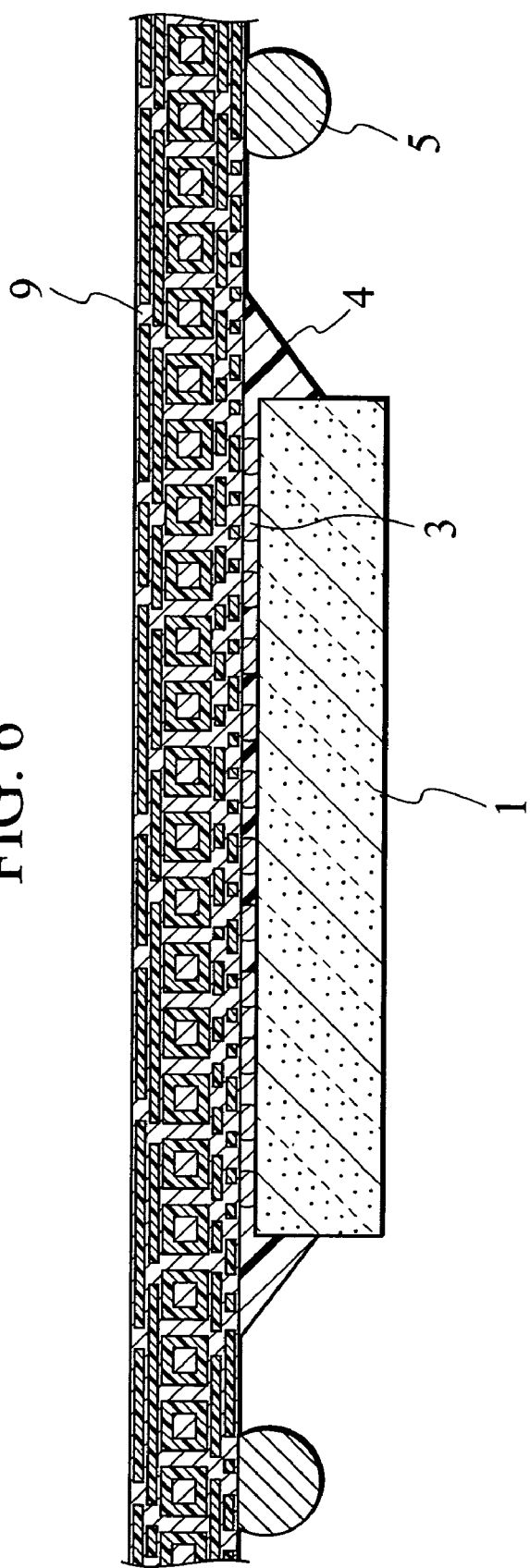
FIG. 6 is a schematic cross-sectional structural diagram of a flip chip mounted semiconductor device according to a modified example 1 of the second embodiment of the present invention.

FIG. 6 is a schematic cross-sectional structural diagram of a flip chip mounted semiconductor device according to a modified example 1 of the second embodiment of the present invention.

The flip chip mounted semiconductor device according to the modified example 1 of the second embodiment of the present invention encompasses, as shown in the illustrative cross-sectional structure of FIG. 6, a package substrate 9; a semiconductor package 1, which is connected with the package substrate 9 via flip chip connection bumps 3; underfill resin 4, which protects the connection portion between the package substrate 9 and the semiconductor package 1; and BGA balls 5, which are formed on the undersurface of the package substrate 9. In FIG. 6, the internal structure of package substrate 9 is shown schematically. The detailed structure of package substrate 9 is as shown in FIG. 4.

Figure 7:
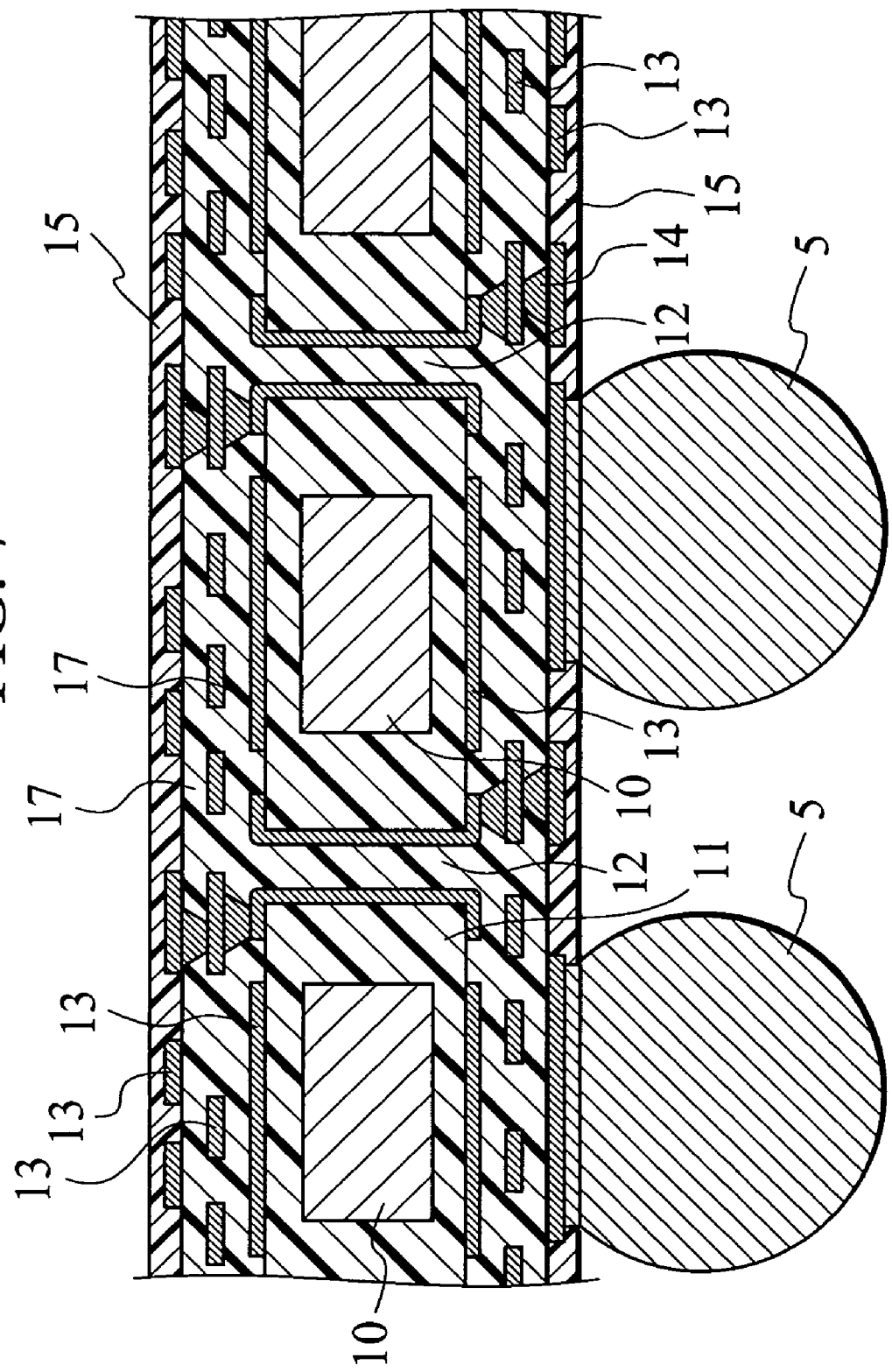
FIG. 7 is a schematic cross-sectional structural diagram showing the detailed structure of the package substrate connected with BGA balls in FIG. 4.
Figure 8:
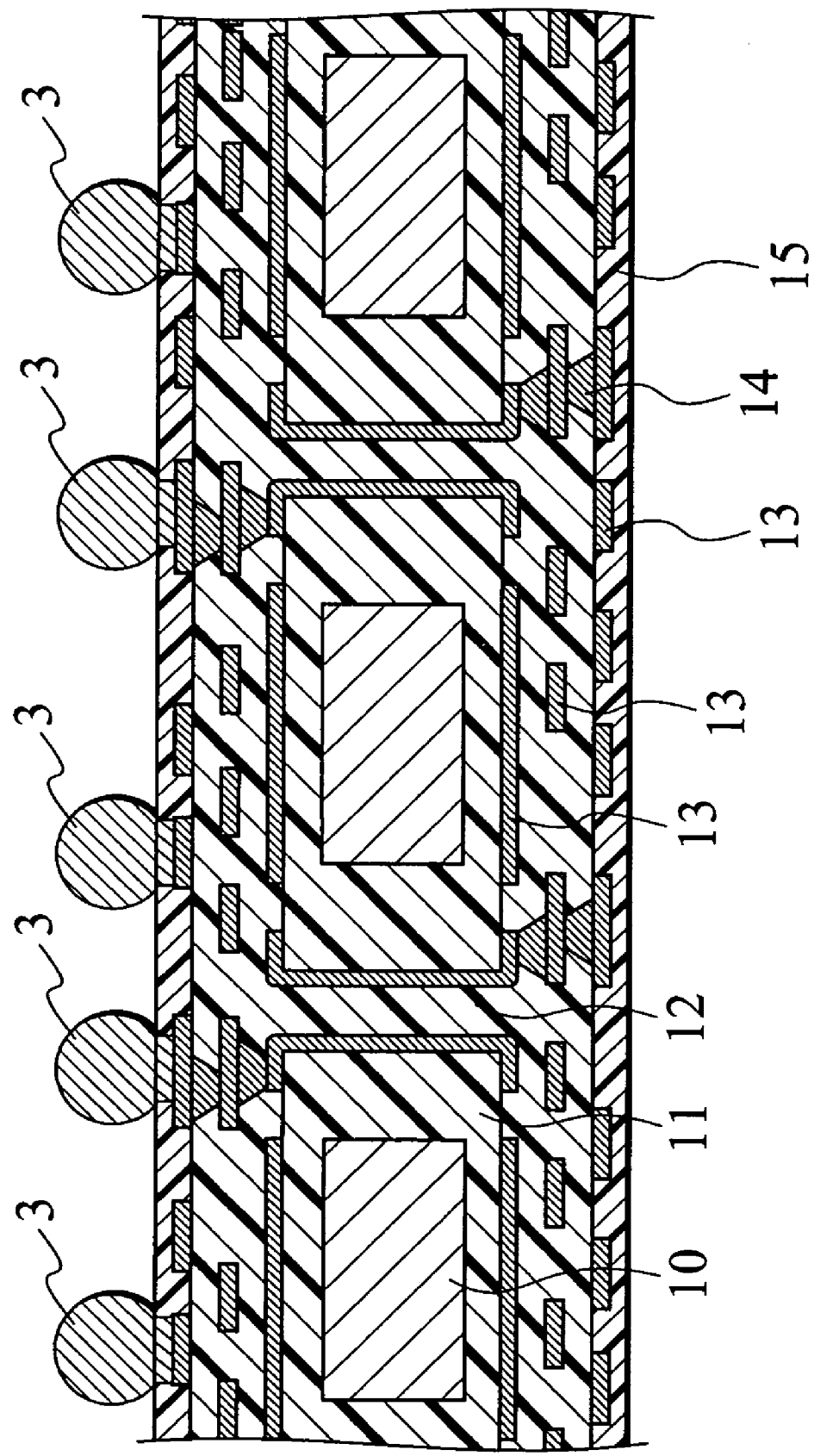
FIG. 8 is a schematic cross-sectional structural diagram showing the detailed structure of the package substrate connected with flip chip connection bumps in FIG. 4.

FIG. 7 is a schematic cross-sectional structural diagram showing the detailed structure of the package substrate connected with BGA balls in FIG. 4. FIG. 8 is a schematic cross-sectional structural diagram showing the detailed structure of the package substrate connected with flip chip connection bumps in FIG. 4. The package substrate 9 and BGA balls 5 shown in FIG. 5 and FIG. 6 are connected by, for example as shown in FIG. 7, forming openings in the solder resist 15 using patterning, forming external connection electrodes using metal deposition, and then bringing the BGA balls 5 into contact with the external connection electrodes. Similarly, the package substrate 9 and flip chip connection bumps 3 shown in FIG. 5 and FIG. 6 are connected by, for example as shown in FIG. 8, forming openings in the solder resist 15 using patterning, forming external connection electrodes using metal deposition, and then bringing the flip chip connection bumps 3 into contact onto these external connection electrodes.

MODIFIED EXAMPLE 2 OF THE SECOND EMBODIMENT

Figure 9:
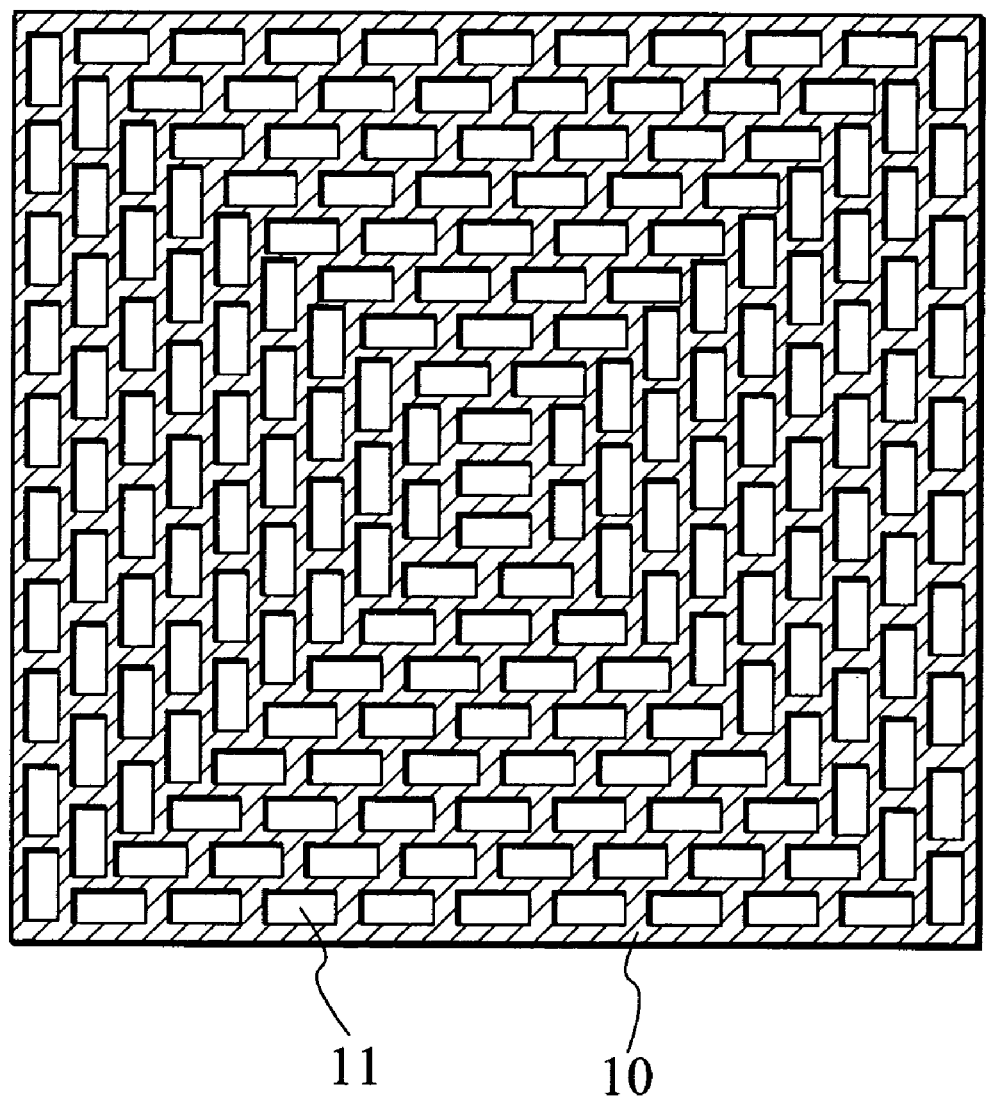
FIG. 9 is a plan view showing the pattern of perforations in the metal plate core used for the flip chip mounted semiconductor device package substrate according to a modified example 2 of the second embodiment of the present invention.

FIG. 9 is a plan view showing the pattern of perforations 11 in the metal plate core 10 used for the flip chip mounted semiconductor device package substrate 9 according to a modified example 2 of the second embodiment of the present invention. As shown in the plan view of FIG. 9, the metal plate forming the metal plate core 10 used in the package substrate 9 and flip chip mounted semiconductor device according to the second embodiment of the present invention is formed with a plurality of perforations 11 and connected therebetween with a crooked line. In the example of FIG. 9, the perforations 11 have rectangular shapes. The arrangement of the perforations 11 is made so that if a straight line is drawn to connect the center of the package substrate 9 with any point on the periphery there will always exist a perforation 11 on that straight line. These arrangements intend to provide flexibility by not arranging inflexible metal plate cores 10 continuously in the direction displacement occurs due to the difference in thermal expansion between the package substrate 9 and mounting substrate 6.

MODIFIED EXAMPLE 3 OF THE SECOND EMBODIMENT

Figure 10:
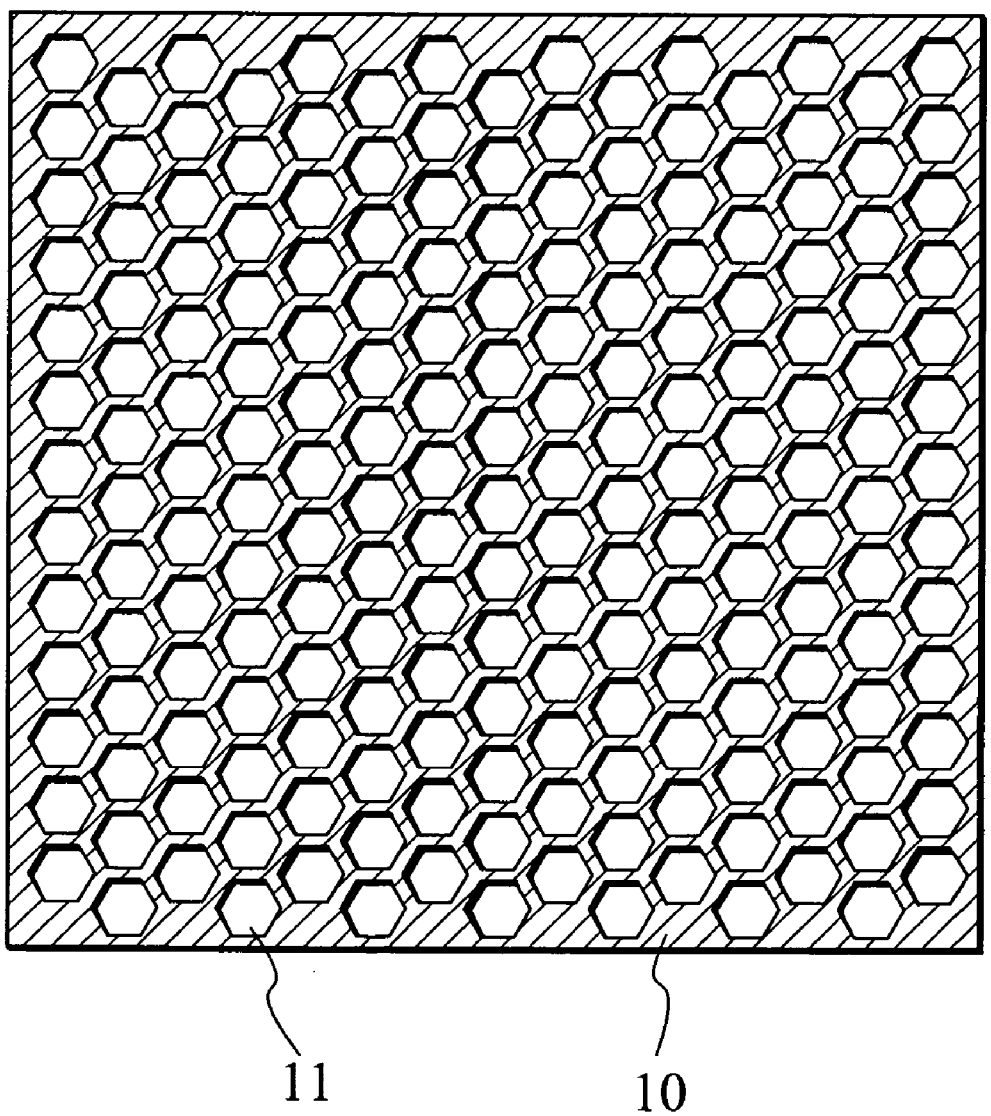
FIG. 10 is a plan view showing the pattern of perforations in the metal plate core used for the flip chip mounted semiconductor device package substrate according to a modified example 3 of the second embodiment of the present invention.

FIG. 10 is a plan view showing of the pattern of perforations 11 in the metal plate core 10 used for the flip chip mounted semiconductor device package substrate 9 according to a modified example 3 of the second embodiment of the present invention. As shown in the plan view of FIG. 10, the metal plate forming the metal plate core 10 used in the package substrate 9 and flip chip mounted semiconductor device according to the second embodiment of the present invention is formed with a plurality of perforations 11 and connected therebetween with a crooked line. In the example of FIG. 10, the perforations 11 have hexagonal shapes. The arrangement of the perforations 11 is made so that if a straight line is drawn to connect the center of the package substrate 9 with any point on the periphery there will always exist a perforation 11 on that straight line. These arrangements intend to provide flexibility by not arranging inflexible metal plate cores 10 continuously in the direction displacement occurs due to the difference in thermal expansion between the package substrate 9 and mounting substrate 6.

Figure 11:
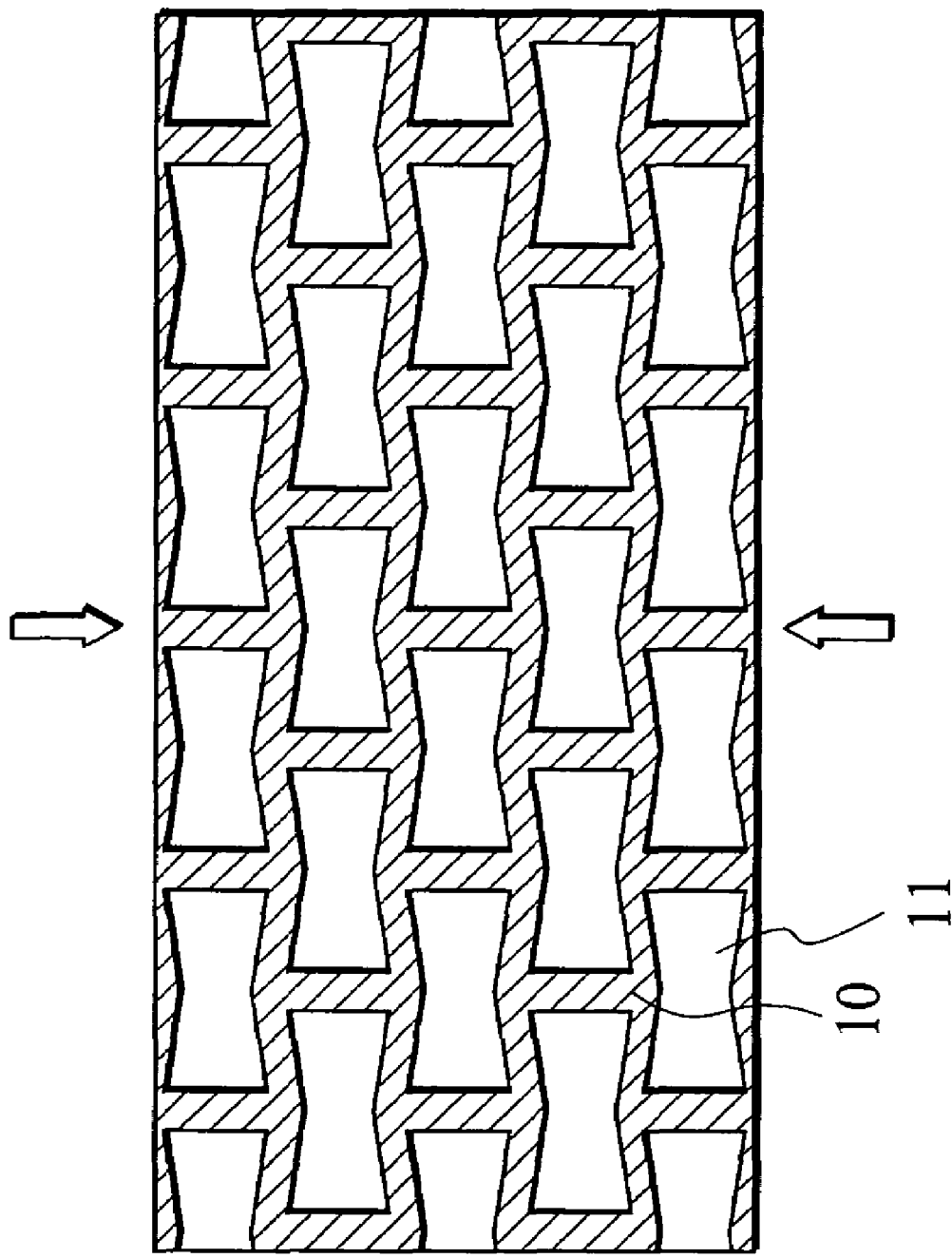
FIG. 11 is a schematic diagram showing the deformation that results from applying compression strain to the metal plate core used in FIG. 9.
Figure 12:
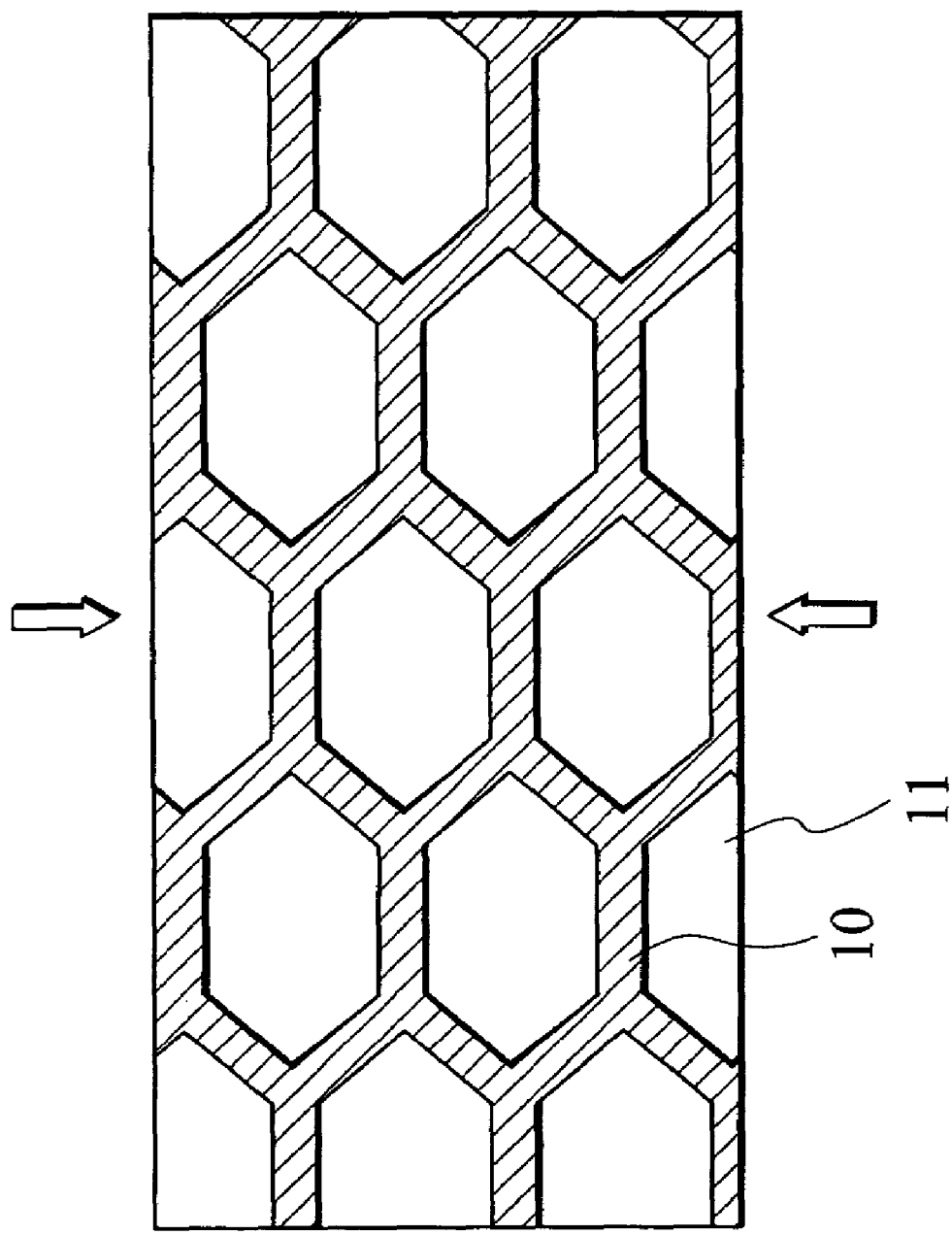
FIG. 12 is a schematic diagram showing the deformation that results from applying compression strain to the metal plate core used in FIG. 10.

FIG. 11 and FIG. 12 show an exaggerated degree of displacement to illustrate schematically how metal plate cores 10 having the respective shapes shown in FIG. 9 and FIG. 10 compress in the directions indicated by the arrows. It can be verified that a flexible structure is produced by not having a continuous metal plate core 10 in the direction of displacement. Of these two examples, the regular hexagonal perforations 11 shown in FIG. 10 and FIG. 12 are preferable, as these constructions allow flexibility in all directions.

THIRD EMBODIMENT

Figure 13:
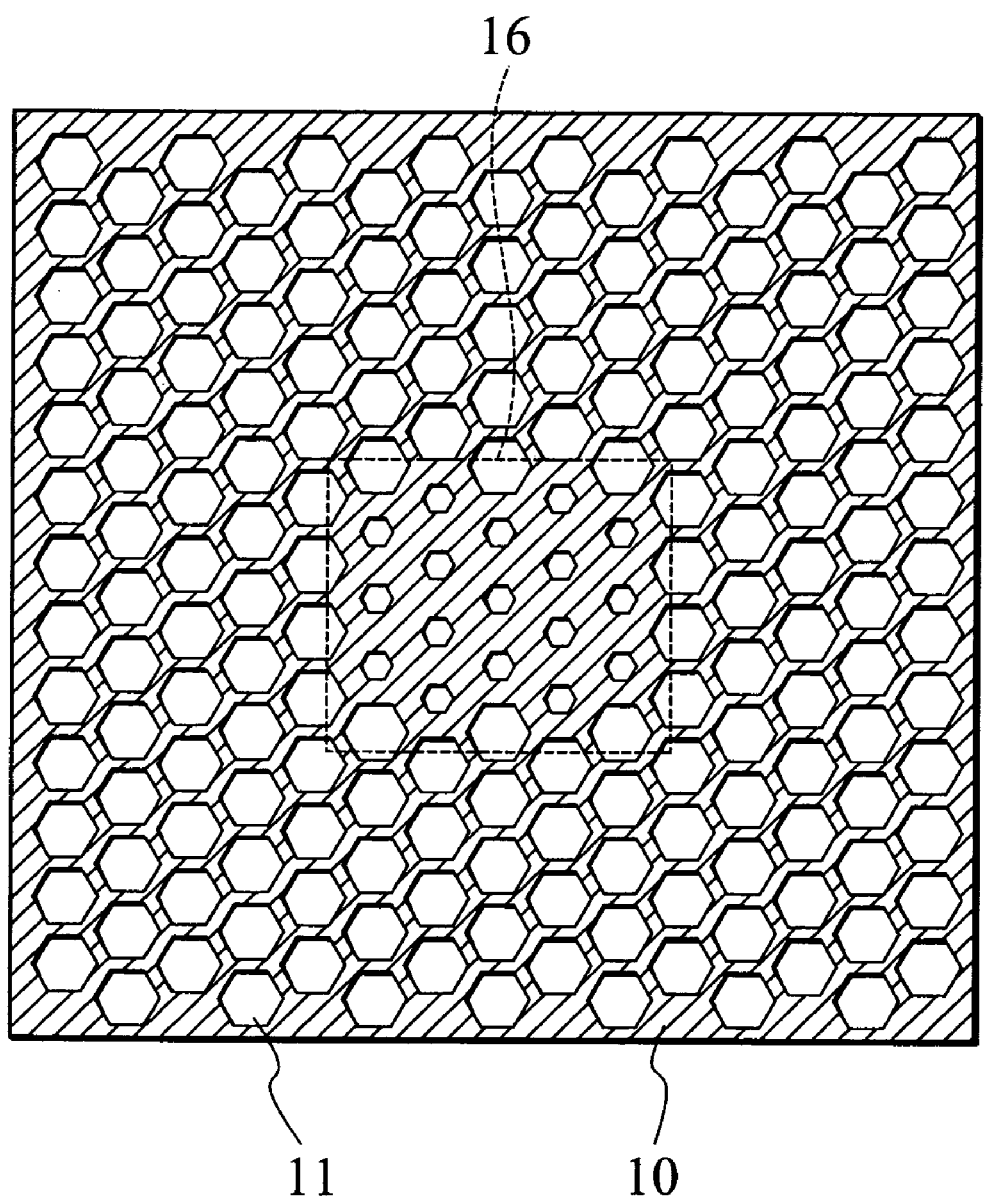
FIG. 13 is a plan view showing the pattern of perforations in the metal plate core used for the flip chip mounted semiconductor device package substrate according to a third embodiment of the present invention.

FIG. 13 is a plan view showing the pattern of perforations in the metal plate core used for the flip chip mounted semiconductor device package substrate according to the third embodiment of the present invention. The package substrate and flip chip mounted semiconductor device according to a third embodiment of the present invention, as shown in the plan view in FIG. 13, has perforations 11 formed in the metal plate core 10 in a hexagonal close-packed layout of regular hexagons. However, in the semiconductor chip mounting region 16, perforation 11 formation is minimized so as to preserve the stiffness/inflexibility and low thermal expansion properties of the semiconductor chip mounting region 16. As a result, warpage caused by the difference in thermal expansion between the semiconductor chip 1 and the package substrate 9 is significantly reduced. For example, in the case where an 18×18 mm$^2$ semiconductor chip 1 is mounted on a 50×50 mm$^2$ package substrate 9, in contrast to the significant warpage, 100 µm for the chip mounting portion and 270 µm for the entire package, occurring when the conventional resin substrate described earlier was used. However, when using the package substrate 9 in the flip chip mounted semiconductor device according to the third embodiment of the present invention, the amount of warpage is extremely small, under 10 µm for the chip mounting portion and 80 µm for the entire package, confirming a dramatic improvement. Moreover, upon making a flip chip connection with a semiconductor chip 1 formed with a Low-k film having a relative dielectric constant of 2.7, fabrication yields of 100% after packaging were obtained.

As with the package substrate 9 according to the modified example 3 of the second embodiment of the present invention shown in FIG. 10, flexibility is preserved throughout the package substrate 9 as a whole since there are more perforations 11 formed in the regions not used for mounting the semiconductor chip. The placement of semiconductor chip mounting in the flip chip mounted semiconductor package is commonly near the center of the package. It is also well known that the strain on the BGA balls 5, which are external connection terminals, due to the difference in thermal expansion vis-à-vis the mounting substrate 6 is more significant for BGA balls that are farther from the center of the package. Accordingly, the flip chip mounted semiconductor device according to the third embodiment of the present invention has a structure which is exceedingly advantageous in that the portion of external connection terminal BGA balls 5 subjected to the strongest strain are selectively made more flexible.

FOURTH EMBODIMENT

Figure 14:
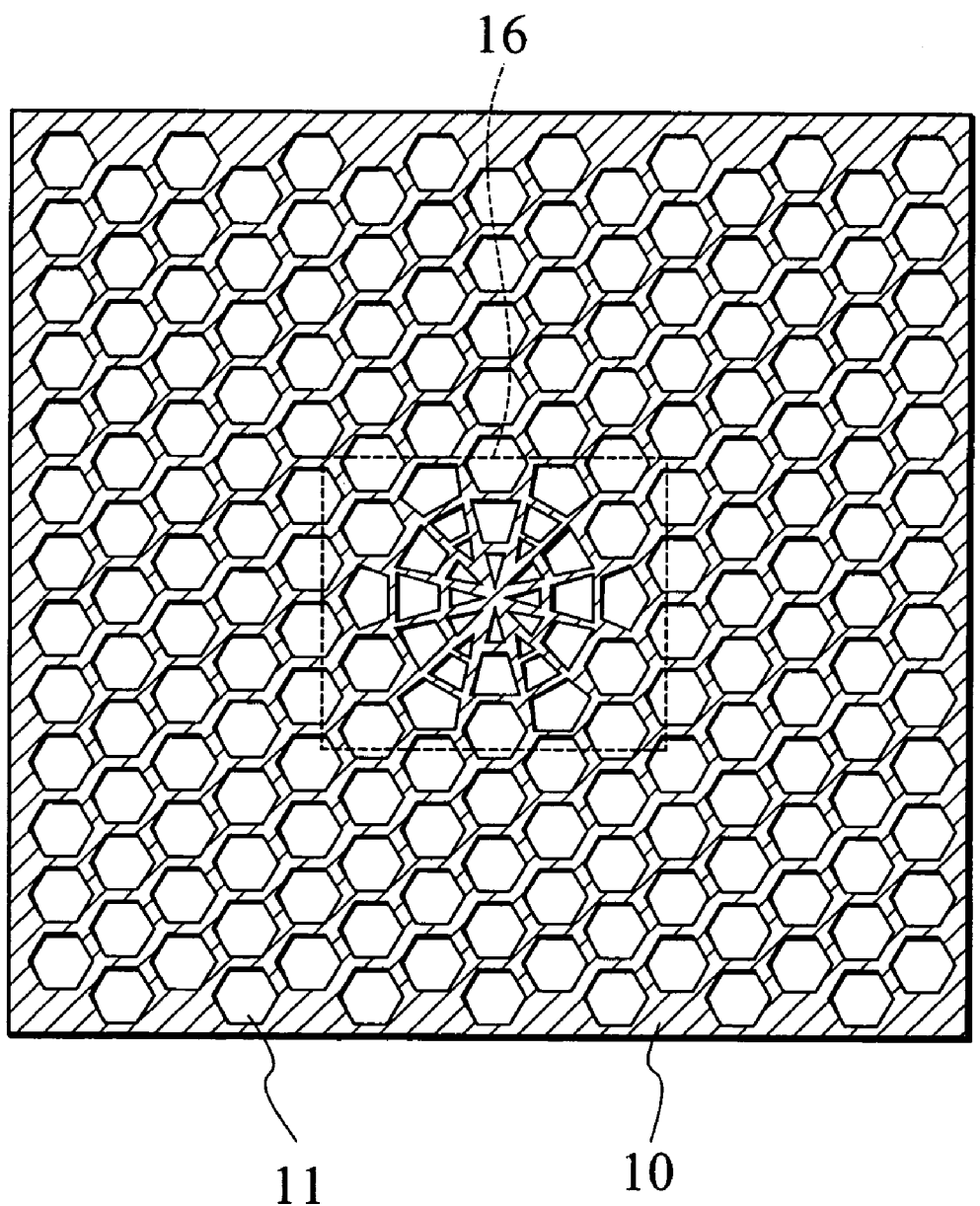
FIG. 14 is a plan view showing the pattern of perforations in the metal plate core used for the flip chip mounted semiconductor device package substrate according to a fourth embodiment of the present invention.

FIG. 14 is a plan view showing the pattern of perforations in the metal plate core used for the flip chip mounted semiconductor device package substrate according to a fourth embodiment of the present invention; The package substrate and flip chip mounted semiconductor device according to the fourth embodiment of the present invention is characterized by a formation where, as shown in the plan view in FIG. 14, the perforations 11 in the metal plate core 10 within the semiconductor chip mounting region 16 are arranged so as to avoid a plurality of straight lines radiating from the center of the semiconductor chip 1. In the example shown in FIG. 14, a pattern of twelve lines radiating from the center of the semiconductor chip 1 in 30° intervals is maintained as non-perforated areas. Any problems from the difference in thermal expansion between the semiconductor chip 1 and the package substrate 9, that is, any strain on the flip chip connection portion, warpage of the semiconductor chip mounting region 16, or the like, are caused by displacement that spreads out in a radial pattern from the center of the semiconductor chip 1 mounted on the semiconductor chip mounting portion 16. Accordingly, by forming a metal plate core 10 that is continuous in the radial direction, a stiff/an inflexible and low thermal expansion package substrate 9 may be obtained. On the other hand, in the regions not used for mounting the semiconductor chip, as with the package substrate and flip chip mounted semiconductor device according to the first and second embodiments, since the metal plate core 10 is not formed continuously in a radial direction extending from the package center, these regions are flexible. Accordingly, strain on the BGA balls 5 that are external connection terminals due to the difference in thermal expansion between the package substrate 9 and the mounting substrate 6 may be reduced.

With the package substrate and flip chip mounted semiconductor device according to the fourth embodiment of the present invention, the surface area ratio of perforated regions to non-perforated regions in the metal plate core 10 is not specified. Accordingly, as with the package substrate and flip chip mounted semiconductor device according to the fourth embodiment of the present invention, the perforated surface area ratio of the semiconductor chip mounting region 16 may be smaller than the perforated surface area ratio of the non-mounted regions, or the semiconductor chip mounting region 16 and the non-mounted regions may have the same perforated surface area ratio. In the latter case, the supply of resin is facilitated during resin infilling into the metal plate core 10 since the amount of resin required is uniform across the entire surface of the package substrate 9. There is also the advantage of obtaining a constant insulation layer thickness when filling the perforations 11 while forming the insulation layers on both the surface and undersurface at the same time.

MODIFIED EXAMPLE OF THE FOURTH EMBODIMENT

Figure 15:
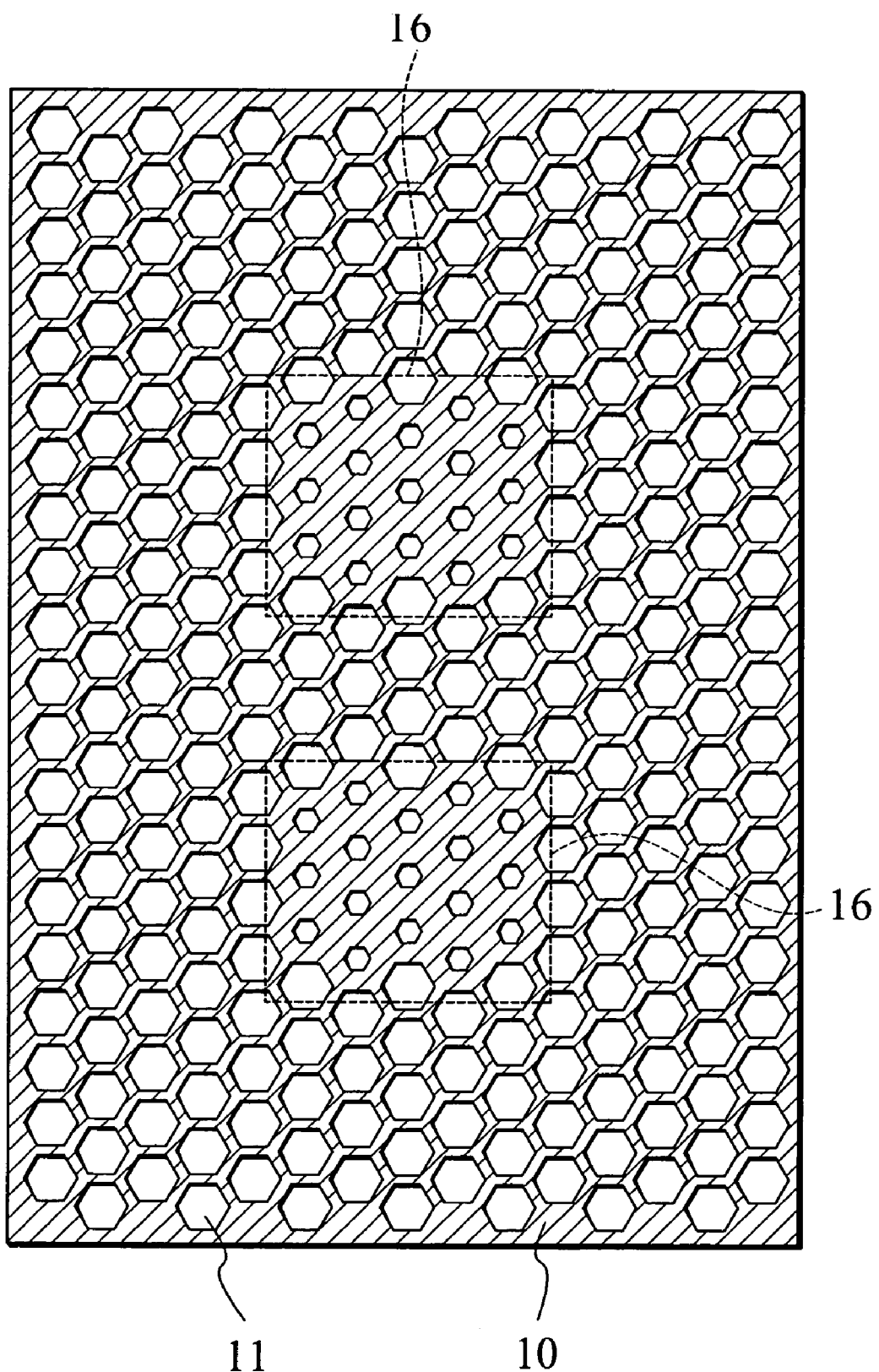
FIG. 15 is a plan view showing the pattern of perforations in the metal plate core used for the flip chip mounted semiconductor device package substrate according to a modified example of the fourth embodiment of the present invention.

FIG. 15 is a plan view showing the pattern of perforations in the metal plate core used for the flip chip mounted semiconductor device package substrate according to a modified example of the fourth embodiment of the present invention. An embodiment of the present invention has been described using a package mounting a single semiconductor chip 1. Naturally, similar results may also be obtained in cases where a plurality of semiconductor chips 1 are mounted. An example having two semiconductor chip mounting regions 16 on the package substrate 9 is illustrated in FIG. 15. As shown in FIG. 15, by arranging a plurality of semiconductor chip mounting regions 16 in the center portion of the package substrate 9, a plurality of semiconductor chips 1 may be mounted with favorable fabrication yield. As with the modified example of the fourth embodiment, warpage caused by the difference in thermal expansion between the semiconductor chip 1 and the package substrate 9 is significantly reduced. As with the package substrate 9 according to the third embodiment of the present invention shown in FIG. 13, flexibility is preserved throughout the package substrate 9 as a whole since more perforations 11 are formed in regions not used for mounting the semiconductor chip. The modified example described above provides two semiconductor chip mounting regions 16, however, the number of regions may be set even higher. Alternatively, the semiconductor chip mounting regions may all be located in the center portion of the package substrate 9 and set in a common region.

FIFTH EMBODIMENT

Figure 16:
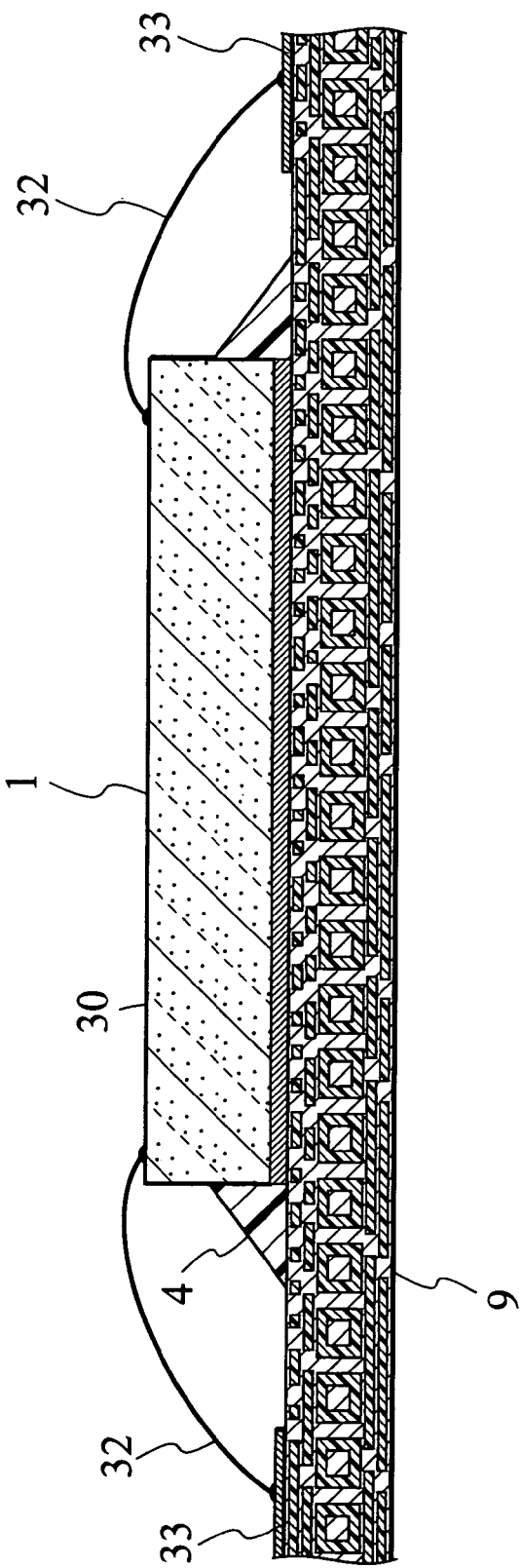
FIG. 16 is a schematic cross-sectional structural diagram showing conditions of how the semiconductor chip is mounted using wire bonding onto the package substrate according to a fifth embodiment of the present invention.

FIG. 16 is a schematic cross-sectional structural diagram showing conditions of how the semiconductor chip is mounted using wire bonding onto the package substrate according to a fifth embodiment of the present invention. An embodiment of the present invention has been described using a flip chip mounted semiconductor package. Naturally, similar results for reducing the strain on the BGA balls may also be obtained in semiconductor packages other than the flip chip mounted. More specifically, a package may also have a structure where a semiconductor chip 1 is mounted face-up on the package substrate 9 and the semiconductor chip 1 and the package substrate 9 are connected through wire bonding. For example, a package substrate 9 according to the fifth embodiment of the present invention, as shown in FIG. 16, is configured with external connection electrodes 30 and 33, which are formed on the package substrate 9; a semiconductor chip 1 on the external connection electrode 30; underfill resin 4; and bonding wires 32. Bonding pads formed on the semiconductor chip 1 and external connection electrodes 33 formed on the package substrate 9 are connected with bonding wires 32. The structure of the package substrate 9 includes, for example, a semiconductor chip 1 arranged in the semiconductor chip mounting region 16 by employing the structure shown in FIG. 14. An external connection electrode 33 is formed on the package substrate 9 at the periphery of the semiconductor chip 1 and connected to bonding pads formed on the semiconductor chip using bonding wires 32 as described above. In the package substrate 9 according to the fifth embodiment of the present invention, an example of connecting a semiconductor chip 1 using wire bonding is shown, and since thermal expansion of the package substrate 9 is kept low, strain on the semiconductor chip 1 and the wire bonding connection portion is kept low, and it is possible to provide a package substrate 9 having favorable yield. FIG. 16 illustrates schematically the internal structure of the package substrate 9. The detailed structure of package substrate 9 is as shown in FIG. 4, similar to the first embodiment.

SIXTH EMBODIMENT

Figure 17:
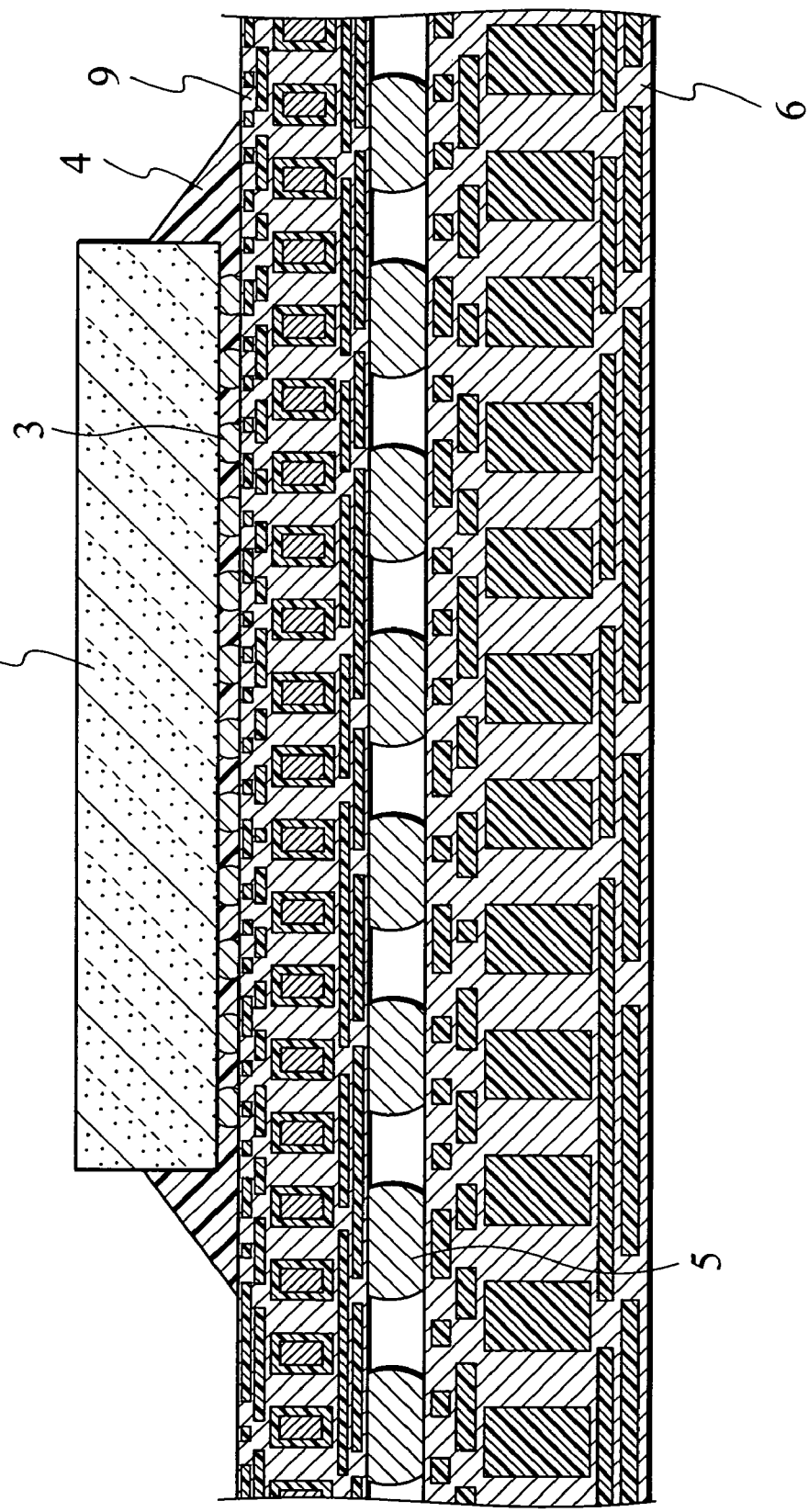
FIG. 17 is a cross-sectional schematic diagram showing a flip chip mounted semiconductor device according to a sixth embodiment of the present invention.

FIG. 17 is a cross-sectional schematic diagram showing a flip chip mounted semiconductor device according to a sixth embodiment of the present invention. A flip chip mounted semiconductor device according to the sixth embodiment of the present invention has a structure such as shown in FIG. 17, and is configured with a mounting substrate 6; a package substrate 9, which is connected to the mounting substrate 6 via BGA balls (solder balls) 5; a semiconductor chip 1, which is connected to the package substrate 9 via flip chip connection bumps 3; and underfill resin 4, which provides protection between the semiconductor chip 1 and the flip chip connection bumps 3. FIG. 17 is an example having a structure where the semiconductor chip 1 is connected to the upper surface of the package substrate 9. FIG. 17 illustrates schematically the internal structures of a package substrate 9 and mounting substrate 6. The detailed structure of the package substrate 9 is shown in FIG. 4. As for the mounting substrate 6, a commonly used substrate of glass epoxy resin is used. The connection of the package substrate 9 and the flip chip connection bumps 3 are as schematically shown in FIG. 8, and the connection of the package substrate 9 and the BGA balls 5 is as shown in FIG. 7.

MODIFIED EXAMPLE OF THE SIXTH EMBODIMENT

Figure 18:
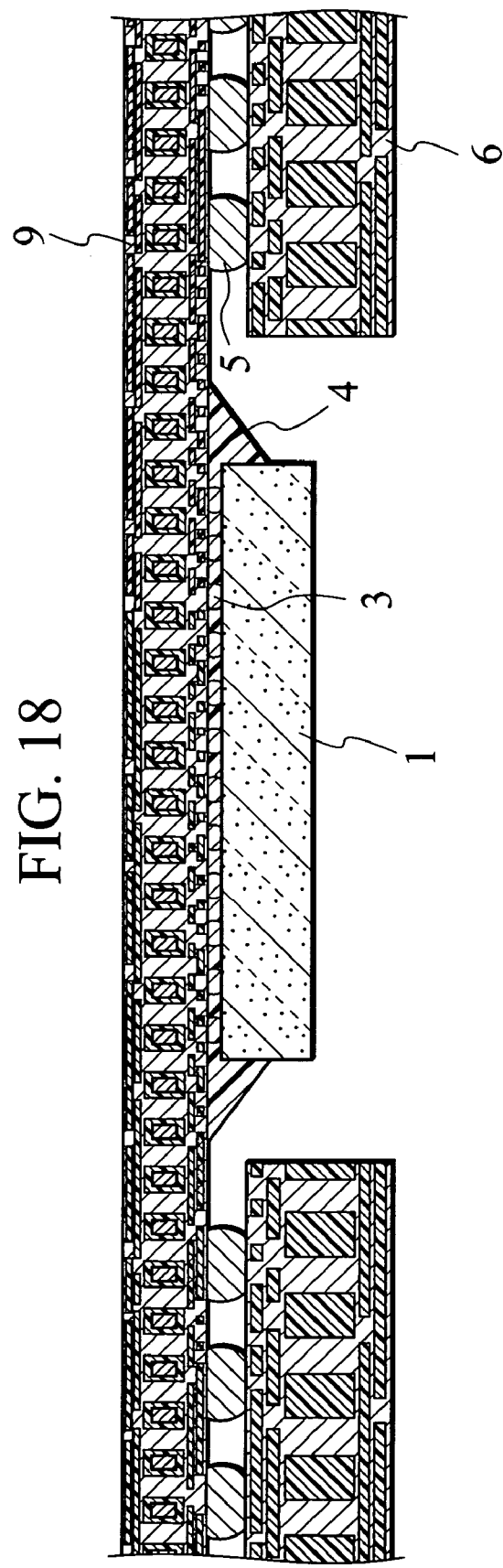
FIG. 18 is a cross-sectional schematic diagram showing a flip chip mounted semiconductor device according to a modified example of the sixth embodiment of the present invention.

FIG. 18 is a cross-sectional schematic diagram showing a flip chip mounted semiconductor device according to a modified example of the sixth embodiment of the present invention. A flip chip mounted semiconductor device according to the modified example of the sixth embodiment of the present invention has a structure such as shown in FIG. 18, and is configured with a mounting substrate 6; a package substrate 9, which is connected to the mounting substrate 6 via BGA balls (solder balls) 5; a semiconductor chip 1, which is connected to the package substrate 9 via flip chip connection bumps 3; and underfill resin 4, which provides protection between the semiconductor chip 1 and the flip chip connection bumps 3. FIG. 18 shows an example having a structure where the semiconductor chip 1 is connected to the undersurface of the package substrate 9. FIG. 18 illustrates schematically the internal structures of a package substrate 9 and mounting substrate 6. The detailed structure of the package substrate 9 is shown in FIG. 4. As for the mounting substrate 6, a commonly used substrate of glass epoxy resin is used. The connection of the package substrate 9 and the flip chip connection bumps 3 are as shown schematically in FIG. 8, and the connection of the package substrate 9 and the BGA balls 5 is as shown in FIG. 7.

SEVENTH EMBODIMENT

Figure 19:
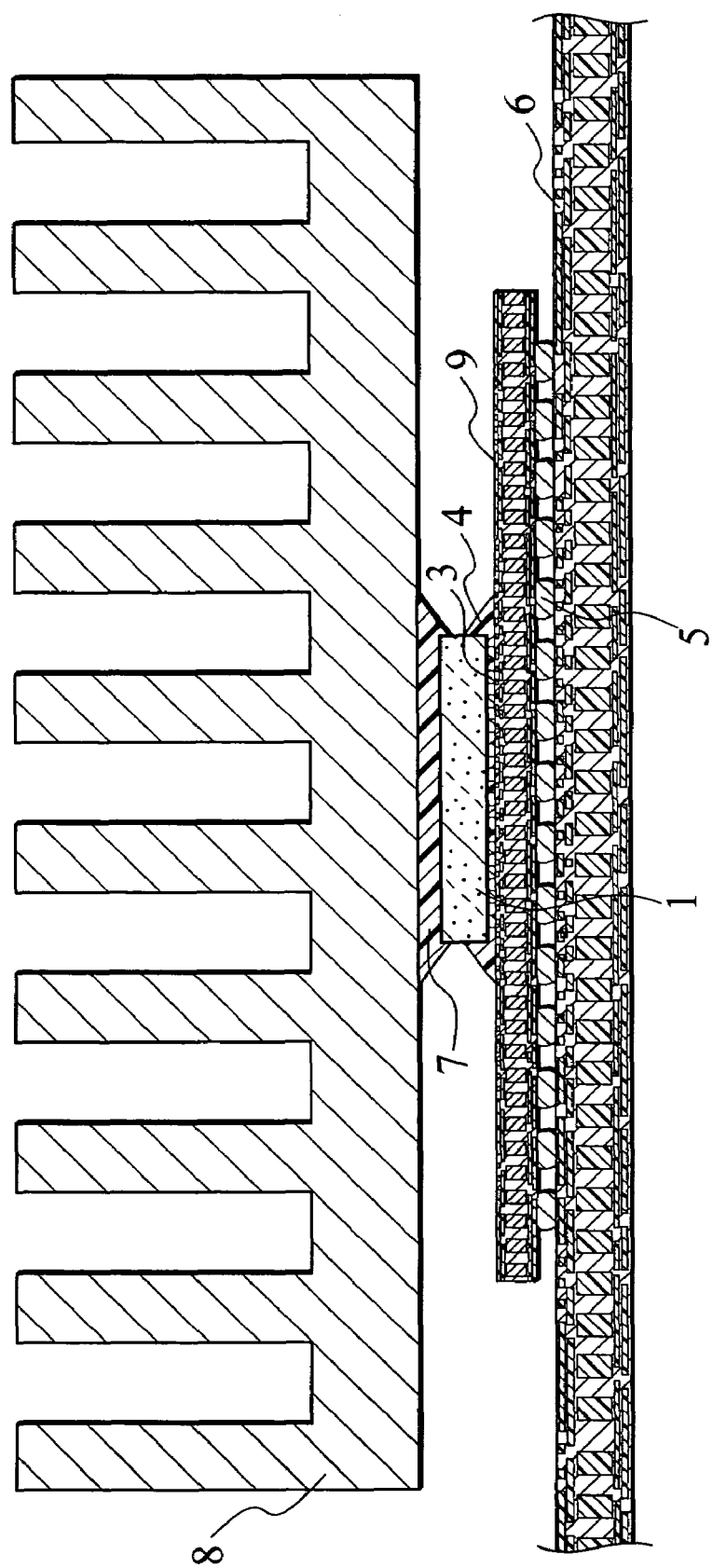
FIG. 19 is a cross-sectional schematic diagram showing a method of mounting a cooling system on the flip chip mounted semiconductor device according to the sixth embodiment of the present invention, which is shown in FIG. 17, and shows a flip chip mounted semiconductor device according to the seventh embodiment of the present invention.
Figure 20:
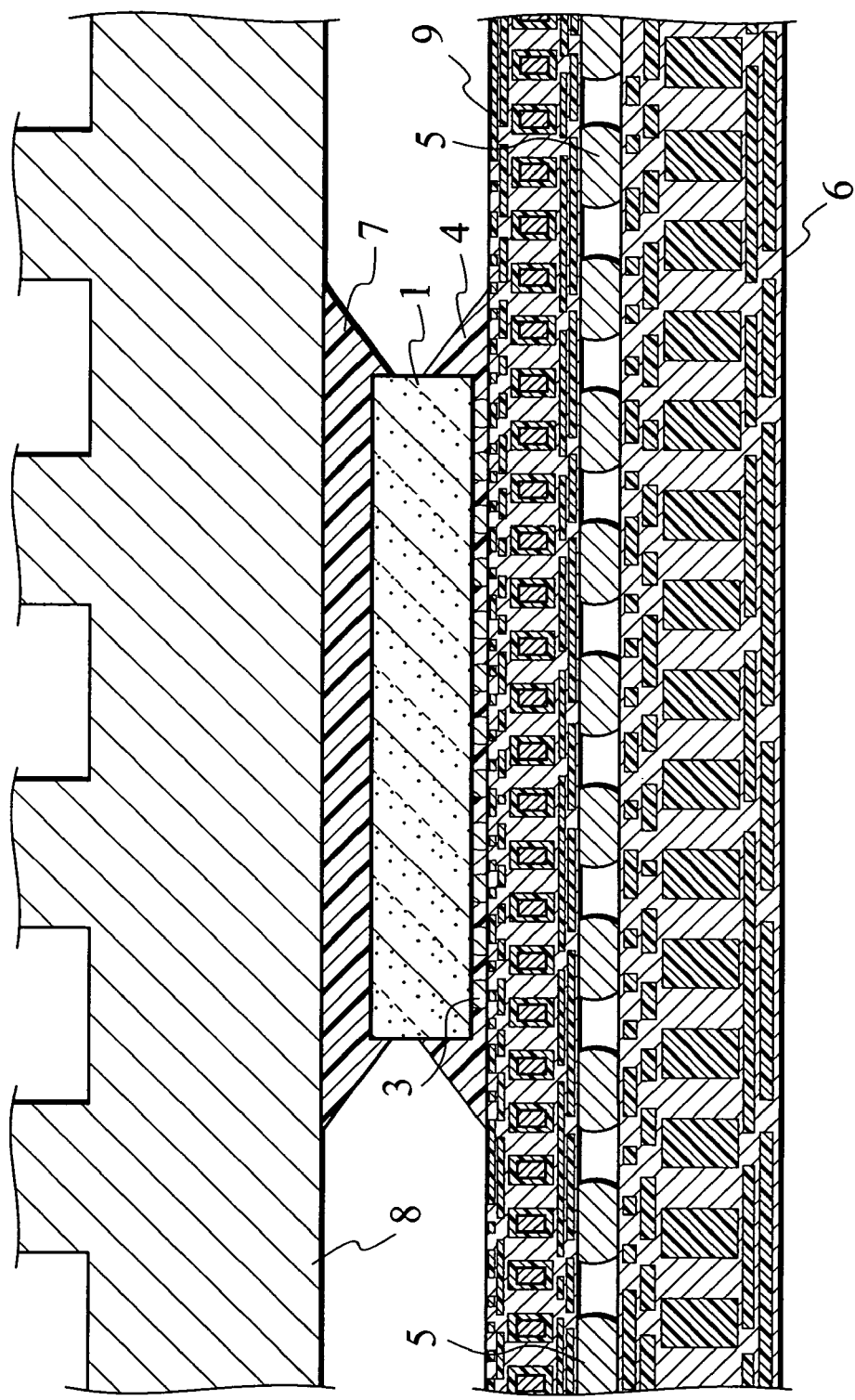
FIG. 20 is an enlarged view of a portion of the semiconductor package in FIG. 19.

FIG. 19 is a cross-sectional schematic diagram showing a method of mounting a cooling system on the flip chip mounted semiconductor device according to the sixth embodiment of the present invention, which is shown in FIG. 17, and shows a flip chip mounted semiconductor device according to the seventh embodiment of the present invention and FIG. 20 is an enlarged view of a portion of the semiconductor package in FIG. 19.

A mounting configuration which allows heat dissipation from the flip chip mounted semiconductor device according to the sixth embodiment of the present invention shown in FIG. 17 includes a heat sink 8, which is mounted to the semiconductor chip 1 via a heat conducting resin 7, as shown in FIG. 19 and FIG. 20. FIG. 19 and FIG. 20 illustrate schematically the internal structures of a package substrate 9 and mounting substrate 6. The detailed structure of the package substrate 9 is shown in FIG. 4. As for the mounting substrate 6, a commonly used substrate of glass epoxy resin is used. FIG. 20 is an enlarged view of a portion near the semiconductor chip 1 in FIG. 19, and shows a mounting substrate 6; a package substrate 9, which is connected to the mounting substrate 6 via BGA balls 5; a semiconductor chip 1, which is connected to the package substrate 9 via flip chip connection bumps 3; underfill 4, which protects the flip chip connection bumps 3 portions; and a heat sink 8, which is connected to the semiconductor chip 1 via the heat conducting resin 7. In the case of flip chip mounted semiconductor packages, heat is normally dissipated to a cooling system, such as the heat sink 8, from the back face of the semiconductor chip 1 via the heat conducting resin 7. A resin using an epoxy or silicone resin as a binder and filled with metal powder is normally used for the heat conducting resin 7. The heat conduction coefficient thereof is approximately 1 W/m/K. When compared with a heat conduction coefficient of 150 W/m/K for the semiconductor chip 1 made of silicon and a heat conduction coefficient of 200 W/m/K in the case of an aluminum heat sink or a heat conduction coefficient of 390 W/m/K in the case of a copper heat sink, thermal conductivity is weak. Accordingly, in order to increase heat dissipation, it is important that the heat conducting resin 7 be made as thin as possible. However, with the flip chip mounted semiconductor package using a conventional resin substrate, since the semiconductor chip 1 begins to warp at 100 µm, a thicknesses of 100 µm and lower are logically impossible. In terms of thermal resistance, this corresponds to an increase of 0.3° C./W. For instance, with a 40 W large scale LSI, the temperature of the transistor climbs by 12° C. and creates an extremely serious problem.

The package substrate 9 used in the flip chip mounted semiconductor devices according to the embodiments of the present invention shown in FIG. 17 through FIG. 20, as shown in the cross-sectional enlarged view of FIG. 4, is configured with a metal core 10; vias 12, which are opened in the metal core 10; micro metal wiring 13; micro vias 14; and solder resist 15, which is formed on both the surface and undersurface of the package substrate 9. Multi-layered micro metal wiring 13 with intermediate insulation layers 17 of built-up resin is formed on both surfaces of the package substrate 9. The vias 12 are filled in with an insulating resin such as glass epoxy.

A package substrate according to an embodiment of the present invention uses a low thermal expansion coefficient substrate with a core made of material having a low coefficient of thermal expansion, and has a multi-layer configuration of built-up wiring layers on both surfaces thereof. In a flip chip mounted semiconductor device according to an embodiment of the present invention, a package substrate made of a low thermal expansion material with a, for example, metal core and both sides thereof layered with built-up wiring layers, and a semiconductor chip are connected using a flip chip. A plurality of perforations or slits are formed in the metal core. Regardless of whether there is a difference in thermal expansion coefficients between the metal core and the mounting substrate, the binding force of the connection terminals that connect with the mounting substrate formed on the package substrate surface is decreased by the perforations or slits formed in the metal core. On the other hand, since the metal core has low thermal expansion, the difference in thermal expansion coefficients vis-à-vis the semiconductor chip is small, and the strain on the flip chip connection bumps and the semiconductor chip surface becomes extremely small. Accordingly, the adhesion of a heat sink is facilitated.

With the package substrate and flip chip mounted semiconductor device according to the first through seventh embodiments of the present invention, it is possible to reduce the difference in thermal expansion coefficient between the semiconductor chip 1 and the package substrate 9 while also reducing strain on the connection terminals between the package substrate 9 and the mounting substrate 6. As a result, it becomes possible to simultaneously achieve the following features. The lifetime of the flip chip connection bumps 3 until breakdown due to thermal cycle stress is increased. The lifetime until separation and cracking develops due to thermal cycle stress in the underfill resin 4 filled in between the semiconductor chip 1 and the package substrate 9 is increased. Even in a case of using a semiconductor chip 1 equipped with a fragile intermediate insulation layer on the semiconductor element formation surface, high package yields are provided and the lifetime until intermediate insulation layer breakdown due to thermal cycle stress is increased. The lifetime until breakdown of the connection terminals formed between the package substrate 9 and the mounting substrate 6, more specifically the BGA balls 5 or LGA connection solder due to thermal cycle stress is increased. Together with reduction in package substrate 9 warpage, the coplanarity of the external connection terminals is improved. Together with the reduction in semiconductor chip 1 warpage, it is possible to make the high heat dissipation heat conduction resin 7 filled in between the cooling component (lid) or heat sink 8 thinner and reduce thermal resistance.

A package substrate and flip chip mounted semiconductor device according to the first through seventh embodiments of the present invention have been described using a low thermal expansion metal plate for the metal plate core 10 of the package substrate 9. However, this has been described as merely a representative example having the highest practicality considering workability. Naturally, similar results may also be obtained with ceramic or glass. In short, any stiff/inflexible, low thermal expansion material may be acceptable.

With the package substrate and flip chip mounted semiconductor device according to the present invention, it is possible to reduce the difference in thermal expansion coefficient between the semiconductor chip and the package substrate while also reducing strain on the connection terminals between the package substrate and the mounting substrate.

OTHER EMBODIMENTS

Various modifications will become possible for those skilled in the art after receiving the teachings of the present disclosure without departing from the scope thereof.

The present invention naturally includes various embodiments not specifically mentioned herein. Accordingly, the technical scope of the present invention is limited only by the following claims as may seem reasonable from the above description.

What is claimed is:

1. A package substrate comprising:
   a substrate defined by top and bottom surfaces and having a plurality of perforations;
   a resin insulation layer configured to implement a multi-level structure disposed on both surfaces of the substrate;
   a built-up wiring layer implementing the multi-level structure disposed on the resin insulation layer on both surfaces of the substrate; and
   a semiconductor chip mounting region provided on the top or the bottom surface of the substrate,
   wherein a perforation exists on any straight line drawn from the center of the substrate to an arbitrary point on a periphery of the substrate, and coaxial polygons are configured so that a center of the coaxial polygons is also the center of the substrate, each of the coaxial polygons is separated by a bridge of the wiring layer, and a layout of the bridge does not extend along a single straight line.

2. The package substrate of claim 1, wherein a thermal expansion coefficient of the substrate has a maximum of 10 ppm/° C.

3. The package substrate of claim 1, wherein the ratio of perforated to non-perforated area in the semiconductor chip mounting region is smaller than the ratio of perforated to non-perforated area in regions where the semiconductor chip is not mounted.

4. The package substrate of claim 1, wherein the perforation is formed so as to avoid a plurality of straight lines extending from the center of the semiconductor chip mounting region to the periphery of the semiconductor mounting region.

5. The package substrate of claim 1, further comprising:
   an external connection electrode formed on the substrate;
   a mounting substrate in order to mount the substrate; and
   a soldering ball configured to be deployed on the external connection electrode and connected to the mounting substrate.

6. The package substrate of claim 1, wherein a plurality of the semiconductor chip mounting regions are provided on the substrate.

7. The package substrate of claim 1, wherein a semiconductor chip mounted to the semiconductor chip mounting region on the substrate is connected through wire bonding.

8. A package substrate comprising:
   a substrate defined by top and bottom surfaces and having a plurality of perforations;
   a resin insulation layer configured to implement a multi-level structure disposed on both surfaces of the substrate;
   a built-up wiring layer implementing the multi-level structure disposed on the resin insulation layer on both surfaces of the substrate; and
   a semiconductor chip mounting region provided on the top or the bottom surface of the substrate,
   wherein a perforation exists on any straight line drawn from the center of the substrate to an arbitrary point on a periphery of the substrate, and perforations are disposed in a rectangular or a polygonal close-packed topology in the substrate.

9. The package substrate of claim 8, wherein a thermal expansion coefficient of the substrate has a maximum of 10 ppm/° C.

10. A package substrate comprising:
a substrate defined by top and bottom surfaces and having a plurality of perforations;
a resin insulation layer configured to implement a multi-level structure disposed on both surfaces of the substrate;
a built-up wiring layer implementing the multi-level structure disposed on the resin insulation layer on both surfaces of the substrate; and
a semiconductor chip mounting region provided on the top or the bottom surface of the substrate,
wherein a perforation exists on any straight line drawn from the center of the substrate to an arbitrary point on a periphery of the substrate, and perforations are disposed in a hexagonal close-packed topology formed in the substrate.

11. The package substrate of claim 10, wherein a thermal expansion coefficient of the substrate has a maximum of 10 ppm/° C.

12. A semiconductor device comprising:
a semiconductor chip having a connection terminal;
a package substrate comprising:
a substrate defined by top and bottom surfaces and having a plurality of perforations,
a resin insulation layer configured to implement a multi-level structure disposed on both surfaces of the substrate,
a built-up wiring layer implementing the multi-level structure disposed on the resin insulation layer on both surfaces of the substrate, and
a flip chip connection bump configured to make a flip chip connection between the semiconductor chip and the package substrate; and
underfill resin configured to seal a gap between the package substrate and the semiconductor chip connected with the flip chip connection,
wherein a perforation exists on any straight line drawn from the center of the substrate to an arbitrary point on a periphery of the substrate, and
wherein coaxial polygons are configured so that a center of the coaxial polygons is also the center of the substrate, each of the coaxial polygons are separated by a bridge of the wiring layer, and a layout of the bridge does not extend along a single straight line.

13. The semiconductor device of claim 12, wherein a thermal expansion coefficient of the substrate has a maximum of 10 ppm/° C.

14. The semiconductor device of claim 12, wherein the ratio of perforated to non-perforated area in the semiconductor chip mounting region is smaller than the ratio of perforated to non-perforated area in regions where the semiconductor chip is not mounted.

15. The semiconductor device of claim 12, wherein the perforation is formed so as to avoid a plurality of straight lines extending from the center of the semiconductor chip mounting region to the periphery of the semiconductor mounting region.

16. The semiconductor device of claim 12, wherein the package substrate further comprises:
an external connection electrode formed on the substrate;
a mounting substrate in order to mount the substrate; and
a soldering ball, which is deployed on the external connection electrode and connected to the mounting substrate.

17. The semiconductor device of claim 12, wherein a plurality of the semiconductor chip mounting regions are provided on the substrate.

18. A semiconductor device comprising:
a semiconductor chip having a connection terminal;
a package substrate comprising:
a substrate defined by top and bottom surfaces and having a plurality of perforations,
a resin insulation layer configured to implement a multi-level structure disposed on both surfaces of the substrate,
a built-up wiring layer implementing the multi-level structure disposed on the resin insulation layer on both surfaces of the substrate, and
a flip chip connection bump configured to make a flip chip connection between the semiconductor chip and the package substrate; and
underfill resin configured to seal a gap between the package substrate and the semiconductor chip connected with the flip chip connection,
wherein a perforation exists on any straight line drawn from the center of the substrate to an arbitrary point on a periphery of the substrate, and
wherein perforations are disposed in a rectangular or a polygonal close-packed topology in the substrate.

19. The semiconductor device of claim 18, wherein a thermal expansion coefficient of the substrate has a maximum of 10 ppm/° C.

20. A semiconductor device comprising:
a semiconductor chip having a connection terminal;
a package substrate comprising:
a substrate defined by top and bottom surfaces and having a plurality of perforations,
a resin insulation layer configured to implement a multi-level structure disposed on both surfaces of the substrate,
a built-up wiring layer implementing the multi-level structure disposed on the resin insulation layer on both surfaces of the substrate, and
a flip chip connection bump configured to make a flip chip connection between the semiconductor chip and the package substrate; and
underfill resin configured to seal a gap between the package substrate and the semiconductor chip connected with the flip chip connection,
wherein a perforation exists on any straight line drawn from the center of the substrate to an arbitrary point on a periphery of the substrate, and
wherein the perforations are disposed in a hexagonal close-packed topology formed in the substrate.

21. The semiconductor device of claim 20, wherein a thermal expansion coefficient of the substrate has a maximum of 10 ppm/° C.

* * * * *